US006535663B1

(12) United States Patent
Chertkow

(10) Patent No.: US 6,535,663 B1
(45) Date of Patent: Mar. 18, 2003

(54) MICROELECTROMECHANICAL DEVICE WITH MOVING ELEMENT

(75) Inventor: Igal Roberto Chertkow, Ahsdod (IL)

(73) Assignee: Memlink Ltd., Herzelia (IL)

( * ) Notice: Subject to any disclaimer, the term of this patent is extended or adjusted under 35 U.S.C. 154(b) by 97 days.

(21) Appl. No.: 09/619,013

(22) Filed: Jul. 19, 2000

Related U.S. Application Data

(63) Continuation-in-part of application No. PCT/US00/03354, filed on Feb. 10, 2000.
(60) Provisional application No. 60/144,628, filed on Jul. 20, 1999, provisional application No. 60/170,492, filed on Dec. 13, 1999, and provisional application No. 60/170,494, filed on Dec. 13, 1999.

(51) Int. Cl.$^7$ .............................. G02B 6/42; G02B 26/02

(52) U.S. Cl. .............................. 385/18; 385/16; 385/19; 359/230; 359/224

(58) Field of Search .............................. 385/16, 17, 18, 385/19–24; 359/230, 224, 198, 199, 214, 221, 223, 226, 298

(56) References Cited

U.S. PATENT DOCUMENTS

| | | | |
|---|---|---|---|
| 4,703,215 A | 10/1987 | Asano | 310/328 |
| 5,208,880 A | 5/1993 | Riza et al. | |
| 5,479,064 A | 12/1995 | Sano | 310/328 |
| 5,742,712 A | 4/1998 | Pan et al. | 385/18 |

(List continued on next page.)

OTHER PUBLICATIONS

Motamedi et al., "Micro–opto–electro–mechanical devices and on–chip optical processing" *Optical Engineering* 36(5) 1282–1297 May 1997.

Hecht, "Optical switching promises cure for telecommunications logjam", *Laser Focus World*, Sep. 1998.

Toshiyoshi et al., "Electrostatic Micro Torsion Mirrors for an Optical Switch Matrix", *Journal of MEMS* vol. 5, No. 4, Dec. 1996.

Marxer et al., "Vertical Mirrors Fabricated by Deep Reactive Ion Etching for Fiber Optic Switching Applications", *Journal of MEMS*, vol 6, No. 3, Sep. 1997.

Ye et al., "Optimal Shape Design of an Electrostatic Comb Drive in Microelectromechanical Systems" *Journal of MEMS*, vol. 7, No. 1, Mar. 1998.

Akiyama et al., "Scratch Drive Actuator with Mechanical Links for Self–Assembly of Three–Dimensional MEMS", *Journal of MEMS*, vol. 6, No. 1, Mar. 1997.

Chertkow et al., "Opportunities and Limitations of Existing MicroFabrication Methods for Microelectromechanical Devices", *Proc. 25$^{th}$ Israel Conf. on Mechanical Engineering*.

Petersen, "Silicon as a Mechanical Material", *Proceedings of the IEEE*, vol. 70, No. 5, May 1982.

Dickensheets et al, "Silicon Micromachined Scanning Confocal Optical Microscope", *Journal of MEMS*, vol. 7, No. 1 Mar., 1998.

Gilbertson et al., "A survey of Micro–Actuator Technologies for Future Spacecraft Missions" *Practical Robotic Interstellar Flight: Are We Ready? Conference.*

Cronos, Optical MEMS Product Sheet.

*Primary Examiner*—Phan T. H. Palmer
(74) *Attorney, Agent, or Firm*—Pennie & Edmonds LLP

(57) ABSTRACT

A microelectromechanical (MEMS) device has a substrate, and a generally planar moving element, such as a mirror, disposed in parallel to the surface of the substrate. An actuator is operatively engageable with the moving element for selectively actuating the moving element between a first position in a plane horizontal to the surface of the substrate and a second position in that plane. The MEMS device may be effectively used as an optical switch. Various different actuators can be used. Preferably, the device is fabricated using a surface micromachining process.

22 Claims, 18 Drawing Sheets

U.S. PATENT DOCUMENTS

| | | |
|---|---|---|
| 5,774,604 A | 6/1998 | McDonald |
| 5,914,801 A * | 6/1999 | Dhuler et al. ............... 359/230 |
| 5,923,798 A | 7/1999 | Aksyuk et al. |
| 5,943,454 A | 8/1999 | Aksyuk et al. |
| 5,960,132 A | 9/1999 | Lin |
| 5,962,949 A | 10/1999 | Dhuler et al. |
| 5,995,688 A | 11/1999 | Aksyuk et al. |
| 5,998,906 A | 12/1999 | Jerman et al. |
| 6,031,946 A | 2/2000 | Bergmann et al. |
| 6,040,935 A | 3/2000 | Michalicek |
| 6,275,320 B1 | 8/2001 | Dhuler et al. ............... 359/237 |
| 6,134,042 A1 | 10/2001 | Dhuler et al. ............... 359/224 |

* cited by examiner

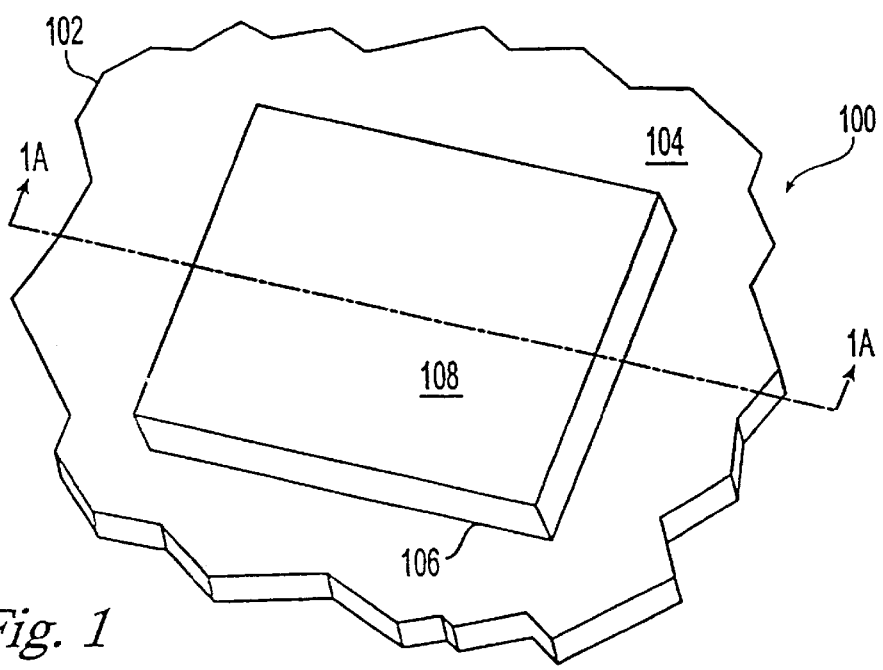
*Fig. 1*
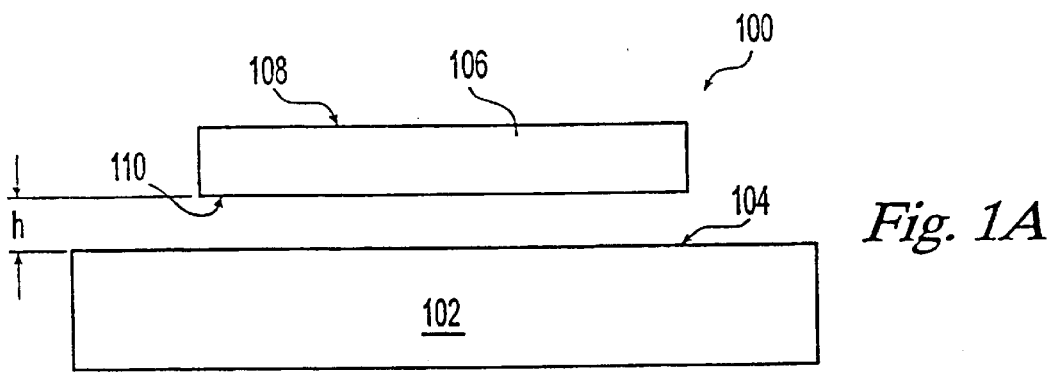
*Fig. 1A*
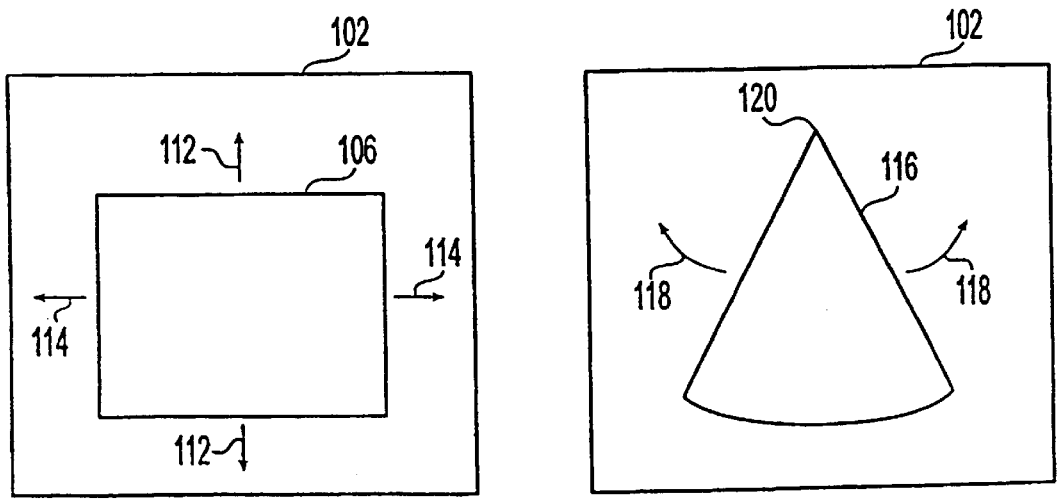
*Fig. 2*  *Fig. 3*

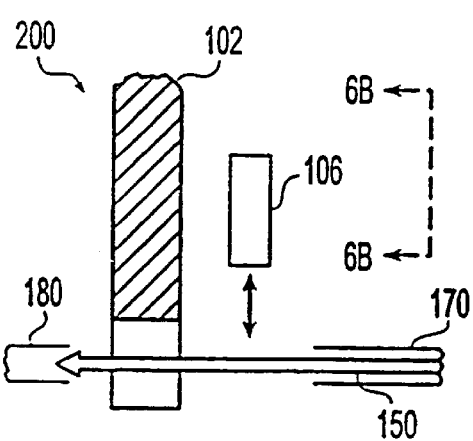 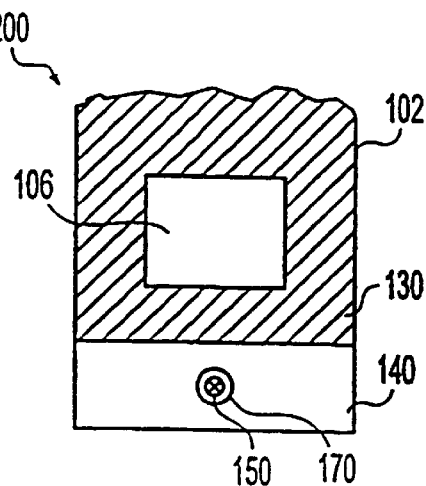
*Fig. 6A*  *Fig. 6B*
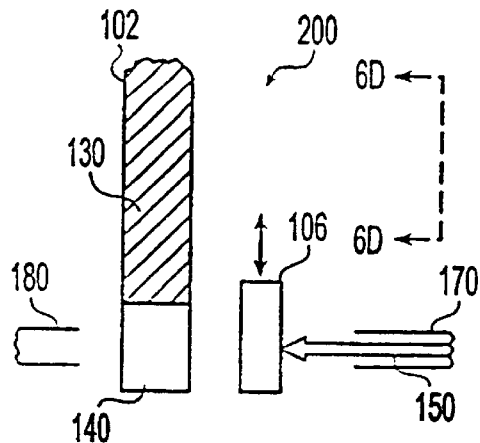 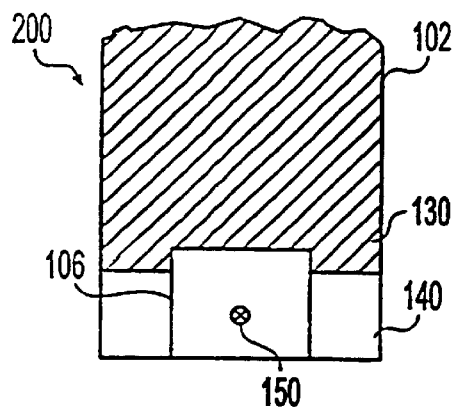
*Fig. 6C*  *Fig. 6D*
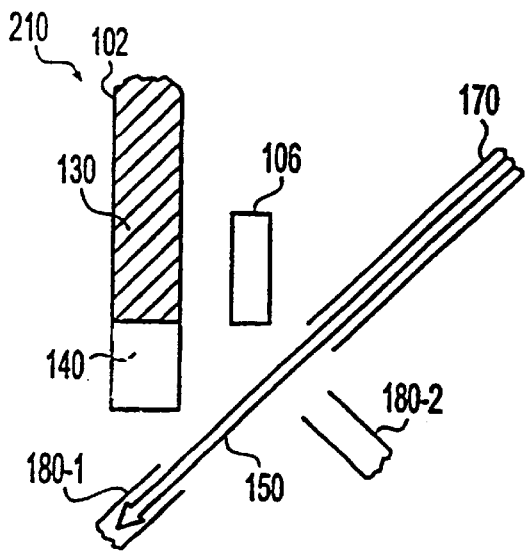 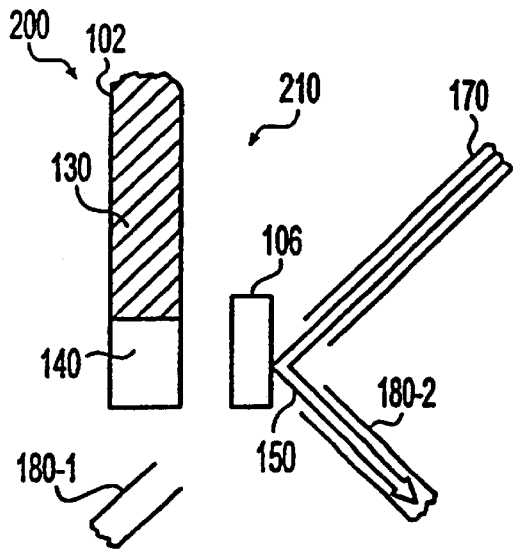
*Fig. 7A*  *Fig. 7B*

MICROELECTROMECHANICAL DEVICE WITH MOVING ELEMENT

CROSS-REFERENCE TO RELATED APPLICATIONS

This application is a continuation-in-part of International Patent Application No. PCT/US00/03354 filed Feb. 10, 2000 designating the United States, the contents of which are incorporated herein by reference. The present application further claims the benefit of priority from: U.S. Provisional Application No. 60/144,628 filed Jul. 20, 1999, the contents of which are incorporated herein by reference; U.S. Provisional Application No. 60/170,492 filed Dec. 13, 1999, the contents of which are incorporated herein by reference; and U.S. Provisional Application No. 60/170,494 filed Dec. 13, 1999, the contents of which are incorporated herein by reference.

FIELD OF INVENTION

The present invention relates to the field of microelectromechanical systems and, more particularly, to microelectromechanical or micromechanical devices that actuate a moving element between operative positions to provide, for example, a switching operation.

BACKGROUND OF THE INVENTION

A microelectromechanical system (MEMS) is a microdevice that is generally manufactured using integrated circuit fabrication or other similar techniques and therefore has the potential for cost-effective, large-scale production. A MEMS device is a high precision system used to sense, control, or actuate on very small scales by combining mechanical, electrical, magnetic, thermal and/or other physical phenomena. It typically includes a tiny mechanical device element such as a sensor, mirror, valve, or gear that is embedded in or deposited on a semiconductor chip or substrate. These systems may function individually, or they may be combined in array configurations to generate effects on a larger scale. Advantageously, a MEMS device may be monolithically integrated with driving, control, and/or signal processing microelectronics to improve performance and further reduce the cost of manufacturing, packaging, and instrumenting the device. As used herein, the term microelectromechanical (MEMS) device is intended to embrace devices that are physically small and have at least one component produced using micromachining or other microfabrication techniques, and the term MEMS device includes microactuators, micromechanical devices, and micromachine devices.

Due to their considerable technological potential, the use of MEMS is currently being pursued in many different fields. In particular, high precision MEMS are receiving an increasing amount of interest in the fiber-optics field because of their capability to overcome several limitations associated with prior art technologies: see generally Motamedi et al., "Micro-opto-electro-mechanical devices and on-chip optical processing", *Optical Engineering,* vol. 36, no. 5, p. 1282 (May 1997), the contents of which are incorporated herein by virtue of this reference.

In fiber-optic communication systems, information is transmitted as a light or laser beam along a glass or plastic wire, known as a fiber. A significant amount of electronic communication and information transfer is effected through fiber-optic lines due to their much broader bandwidth and lower susceptibility to electromagnetic interference compared to conventional copper or metal wires. For example, much of the Internet and many long distance telephone communication networks are connected with fiber-optic lines. However, fast and efficient switching between optical fibers in a fiber-optic network has been difficult to achieve. Switches are needed to route signals at the backbone and gateway levels of these networks where one network connects with another, as well as at the sub-network level where data is being transported from its origin or to its destination. In addition, in a wavelength division multiplexed (WDM) optical fiber network, many channels, each occupying a distinct wavelength of light, may share the same fiber. In a WDM network, optical add-drop multiplexers and demultiplexers are used to introduce supplementary optical channels into the main optical fiber path and/or divert optical channels from the main fiber path.

Various prior art optical switching technologies have been employed. In electrical cross connect switch technology, the optical signal is transformed into an electrical signal, a switching operation is performed with an electronic switch, and the electrical signal is then transformed back into the optical domain. However, electrical cross connects are inefficient and costly. Another prior art solution is to use an optical switch or cross-connect (OXC) capable of connecting and disconnecting optical fibers in the optical domain. Integrated optical OXC devices have been used for this purpose. These devices are constructed of a material, such as lithium niobate, generally in a planar waveguide configuration that allows switching action to take place between various input and output ports. These switching devices do not add a latency or delay to the optical data. However, integrated optical devices have several drawbacks: they are relatively expensive; their minimum size is limited by the physics of optical waveguides; their operation depends strongly on wavelength and is sensitive to polarization; and they result in considerable cross talk and signal attenuation in the fiber optic paths.

In contrast, optical switches based on emerging MEMS technology, including micromechanical or micromachined systems, boast considerable promise for overcoming many of the limitations associated with alternative prior art fiber-optic switching technologies. Optical MEMS systems, also referred to as microoptoelectromechanical systems (MOEMS), use microoptical elements that reflect, diffract, refract, collimate, absorb, attenuate, or otherwise alter or modulate the properties and/or path of a light beam or signal. These types of optical switches can be made very compact and small, typically within the micrometer to millimeter range. The insertion loss of a MOEMS switch interface is comparable to alternative technologies, and occurs mainly at the entry port of the switch where light leaves a first optical fiber and at the exit port of the switch where light re-enters a second optical fiber. These losses are due to the enlargement of the beam dimensions in free space, however, as will be appreciated by those skilled in the art, using appropriate lenses can decrease this effect. The medium of a MOEMS switch is typically air, but a vacuum, inert gas, or other suitable fluid may also be used. The transmission of light within the switch medium amounts for only a small portion of the overall attenuation. Additionally, the non-blocking medium of the switch ensures that no interference occurs when different light paths cross, enabling light beams to traverse without mutual effect, attenuation, or cross-talk: see generally, Hecht J., "Optical switching promises cure for telecommunications logjam", *Laser Focus World,* page 69, (September 1998), the contents of which are incorporated herein by virtue of this reference. This property further enables the utilization of MOEMS switches in complex array configurations.

For example, micromachined optical switches often use small mirrors that move to perform a switching operation. By actuating the moving element between a first position in which a light beam is allowed to pass unaffected by the mirror and a second mirror position in which the moving element reflects or interferes with the light beam, the path of an input light beam can be redirected into different outputs or otherwise interfered with. The use of mirrors, in particular, is advantageous since they operate independently of wavelength when reflecting an optical beam. However, MEMS switches or valves may also use other types of moving elements such as attenuators, filters, lenses, collimators, modulators, and absorbers to perform a desired switching operation.

In general, to achieve low attenuation losses in a micromachined optical switch, a mirror or other optical element should be very smooth and of optical grade. In addition, the principle and means used to actuate the moving element of a MEMS device should be fast, simple, and provide reproducible and accurate alignment of the moving element. Furthermore, the actuator must be able to move that element by a sufficient amount to accomplish the switching task.

Several prior art MEMS optical switching devices are known,. as for example those described by Toshiyoshi et al., "Electrostatic Micro Torsion Mirrors for an Optical Switch Matrix", *Journal of Microelectromechanical Systems,* vol. 5 no. 4, p. 231 (December 1996) and by Marxer et al., "Vertical Mirrors Fabricated by Deep Reactive Ion Etching for Fiber Optic Switching Applications", *Journal of Microelectromechanical Systems,* vol. 6, no. 3, p. 277 (September 1997). Aksyuk et al. in U.S. Pat. Nos. 5,923,798, 5,943,454, and 5,995,688 also disclose several embodiments of a MEMS optical switching device having an actuator that is mechanically linked to an optical interrupter such as a modulator or mirror. The actuator is provided on a support substrate, and the optical interrupter is vertically or perpendicularly disposed to the surface of the substrate. The actuator, which includes a moveable and a fixed electrode, imparts a motion to a mechanical linkage that in turn causes the interrupter to move within the vertical plane, and thereby into or out of the path of an optical signal. Jerman et al. in U.S. Pat. No. 5,998,906 discloses an electrostatic microactuator having first and second electrode comb drive assemblies, one fixed to a substrate and the other moveable thereupon. A mirror aligned perpendicularly to the surface of the substrate is actuated between a retracted and an extended position to selectively provide an optical switching function. Similarly, Riza et al. in U.S. Pat. No. 5,208,880 discloses an optical microdynamical switch having a mirror securely and mechanically coupled to a piezoelectric actuator which, in turn, is disposed on a substrate. The mirror is oriented perpendicularly to the substrate and at an angle of 45° to incident light. By translating the mirror, reflected light is selectively directed into a desired output port.

These and other prior art MEMS actuated devices suffer from certain drawbacks. Notably, the optical moving element or mirror of these MEMS switching devices is positioned vertically or perpendicularly with respect to the substrate surface, typically by etching into a wafer or substrate. With such a configuration, during operation of the device, the position of the optical moving element is subject to deviations from the desired normal angle of 90°, resulting in additional losses being inserted within the system as well as a possible reduction in accuracy and/or repeatability. Also, in many of these designs, the horizontal translation of a vertically positioned mirror (or other generally planar optical moving element) may be considerably slowed by air resistance against the surface of the mirror.

U.S. Pat. No. 5,774,604 to McDonald discloses a reflective micromechanical structure positioned on the support surface of a well, between an input fiber and at least two output fibers. If the structure is in an unaddressed state, parallel to the support surface, light travels unaffected from the input fiber into an in-line output fiber. If the structure is in an addressed state, tilted and at an angle to the support surface, the light is reflected and eventually provided to another output fiber. The state of the structure is controlled by actuating circuitry in the support surface. Again, the insertion loss, repeatability, and accuracy of the McDonald switching device may also be affected by deviations of the desired angle of the structure, particularly since the tilt angle changes with every switching operation. Furthermore, the tilting switching device described by McDonald is only suitable for optical switches having a single input.

More generally, Dhuler et al. in U.S. Pat. No. 5,962,949 disclose a MEMS micro-positioning device designed to precisely position objects during micro-assembly, manipulation of microbiological specimens, or alignment of an optical fiber with another optical element. The device includes a reference surface/substrate, a support fixed to the surface, and a stage. The object, e.g. a fiber, that is to be manipulated or aligned is placed on the stage, preferably in a notch or other receptacle. The stage is suspended above the reference surface, and the support is disposed adjacent to at least one and preferably two sides of the stage by means of springs. First and second actuators on the support are used to move the stage, and objects carried by the stage, in perpendicular directions within a horizontal plane. The actuators include a number of thermally activated arched beams that are connected to an actuator member that extends toward the stage. When the beams are heated, they expand toward the stage causing the actuator member to push the stage in a fixed direction. One or more vertical actuators are used to bend the stage, and thereby move the specific portion of the surface of the stage on which the object is located in a desired vertical direction. Due to the nature, shape, and bending of the stage, the MEMS actuator disclosed by Dhuler et al. is not suitable for precisely holding a generally flat or planar shaped element such as a mirror. Furthermore, the actuator is only capable of moving the stage within a small range of travel for alignment purposes. This is insufficient to accommodate a moving element that must be actuated along a relatively long travel path, as for example in an optical switch where the element is selectively actuated out of and into the path of an optical signal. Consequently, the MEMS actuator disclosed by Dhuler et al. is inappropriate for use as an optical switch that actuates a moving element such as a mirror. Other prior art MEMS device actuators, such as the comb drive actuator described by Ye et al. in "Optimal Shape Design of an Electrostatic Comb Drive in Microelectromechanical Systems", *Journal of Microelectromechanical Systems,* vol. 7, no. 1, p. 16 (March 1998) are similarly limited with respect to the permissible range of travel of a moving element connected thereto.

In addition, in prior art MEMS devices that actuate a moving element the design of the actuator and the mechanical coupling of the actuator to the moving element typically generates a significant amount of dynamic friction during actuation: see for example Akiyama et al., "Scratch Drive Actuator with Mechanical Links for Self-Assembly of Three-Dimensional MEMS", *Journal of Microelectromechanical Systems,* vol. 6, no. 1, p. 10 (March 1997). As such devices are operated over time, the dynamic friction tends to wear the device components and reduce the reliability and positioning accuracy of the device. Similarly, the moving element of these MEMS devices are generally attached to the substrate or a support component of the device by means of weights, springs, clamps, or other like mechanisms. Again, because these parts are in physical contact with one another, there is dynamical friction during actuation and the parts may wear, leading to reduced device accuracy.

There is therefore a need for an improved MEMS device capable of rapidly and efficiently actuating a generally flat or planar moving element such as a mirror to provide, for example, a switching operation. It would further be desirable if such a MEMS device were not susceptible to wear from dynamic friction effects and exhibited minimal insertion loss when used as an optical switch or cross connect.

SUMMARY OF THE INVENTION

The present invention provides a microelectromechanical (MEMS) device having a generally planar moving element disposed in parallel to the surface of a substrate; and an actuator operatively engageable with the moving element for selectively moving the element between a first position in a plane horizontal to the surface of the substrate and a second position in that plane. The moving element preferably travels in a linear path, but others paths such as radial are also possible.

The device is particularly suitable for use as an optical switch where the moving element alters the characteristics of an optical beam when in the first position but does not affect the optical beam when in the second position. In this case, the moving element preferably comprises a mirror, but it may also comprise a modulator, lens, collimator, attenuator, filter, or absorber. The substrate may include a zone which is penetrable by the optical beam and the optical beam may be directed at the device so that the optical beam passes through the penetrable zone when the moving element is in the second position. The penetrable zone may be an aperture formed within the substrate or it may comprise an optically transparent material.

In one embodiment, the actuator comprises an elastic material having a surface and positioned between the substrate and the moving element. The actuator further includes an elastic wave inducer for generating a traveling elastic wave on the surface of the elastic material. In this manner, the propagation of the elastic wave on the surface serves to move the moving element. The elastic wave inducer may comprise a first substrate electrode, a second substrate electrode, a ground electrode coupled between the moving element and the surface of the elastic material, and circuitry for providing a first AC electric signal between the first substrate electrode and the ground electrode and a second AC electric signal between the second substrate electrode and the ground electrode. The first and second AC electric signals are out of phase with one another so that a traveling elastic wave is generated.

In another embodiment, the actuator comprises a plurality of elongated actuating beams spaced perpendicularly to and along a travel path of the moving element. Each beam extends substantially parallel to the surface of the substrate and has a tip, and a base that is rigidly fixed with respect to the substrate. The actuator further includes a beam actuator that controllably moves the actuating beams so that the beams that are positioned along the portion of the travel path in which the moving element is located intermittently engage the moving element and thereby move the moving element in a desired direction along the travel path. The beams are preferably conductive and the beam actuator preferably comprises, for each actuating beam: a first electrode connected to the substrate and positioned vertically from that actuating beam with respect to the surface of the substrate; a second electrode connected to the substrate and positioned horizontally from the actuating beam with respect to the surface of the substrate; and circuitry for controllably generating a first electric field between the first electrode and the actuating beam to move that actuating beam in a vertical direction with respect to the surface of the substrate, and a second electric field between the second electrode and the actuating beam to move that actuating beam in a horizontal direction with respect to the surface of the substrate.

Where the travel path is linear and has first and second edges, the plurality of actuating beams preferably comprises a first set of actuating beams spaced along the first edge of the travel path; and a second set of actuating beams spaced along the second edge of the travel path, the beam actuator controllably moving the tips of the beams in the first set synchronously with the tips of the beams in the second set. In each of the first and second sets, adjacent ones of the actuating beams that are located along the edge of the portion of the travel path in which the moving element is located may rotate out of phase so that the intermittent engagement of the moving element by adjacent tips in each set is successive. Alternatively, where the moving element rests on static support members fixed to the substrate, in each of the first and second sets, the actuating beams that are located along the edge of the portion of the travel path in which the moving element is located may rotate in phase so that the intermittent engagement of the moving element by said beams in each set is simultaneous.

Other actuators may also be used. In all embodiments, the moving element preferably includes a conductive component, and the device further comprises at least one substrate electrode and circuitry for generating an electric field between the conductive component and the substrate electrode or electrodes to hold the moving element by means of static friction.

The device is preferably fabricated using micromachining techniques, and with the moving element fabricated in a position parallel to the surface of the substrate. More preferably, surface micromachining techniques are employed in which a plurality of material layers are sequentially deposited and etched. Arrays of the devices may also be provided on a common substrate, each device having its own moving element and actuator.

BRIEF DESCRIPTION OF THE DRAWINGS

The objects and advantages of the present invention will be better understood and more readily apparent when considered in conjunction with the following detailed description and accompanying drawings which illustrate, by way of example, preferred embodiments of the invention and in which:

FIG. 1 is an isometric view of the general configuration of a MEMS device in accordance with the present invention;

FIG. 1A is a cross-sectional view of the device taken along the line 1A—1A in FIG. 1;

FIG. 2 shows the shape and motion of a moving element of the device in a preferred embodiment of the present invention;

FIG. 3 shows an alternative shape and motion of the moving element;

FIGS. 6A–6D illustrate the operation of the device as a 1×1 (ON/OFF) optical switch;

FIGS. 7A and 7B illustrate the operation of the device as a 1×2 optical switch

DETAILED DESCRIPTION OF PREFERRED EMBODIMENTS

Figure 4:
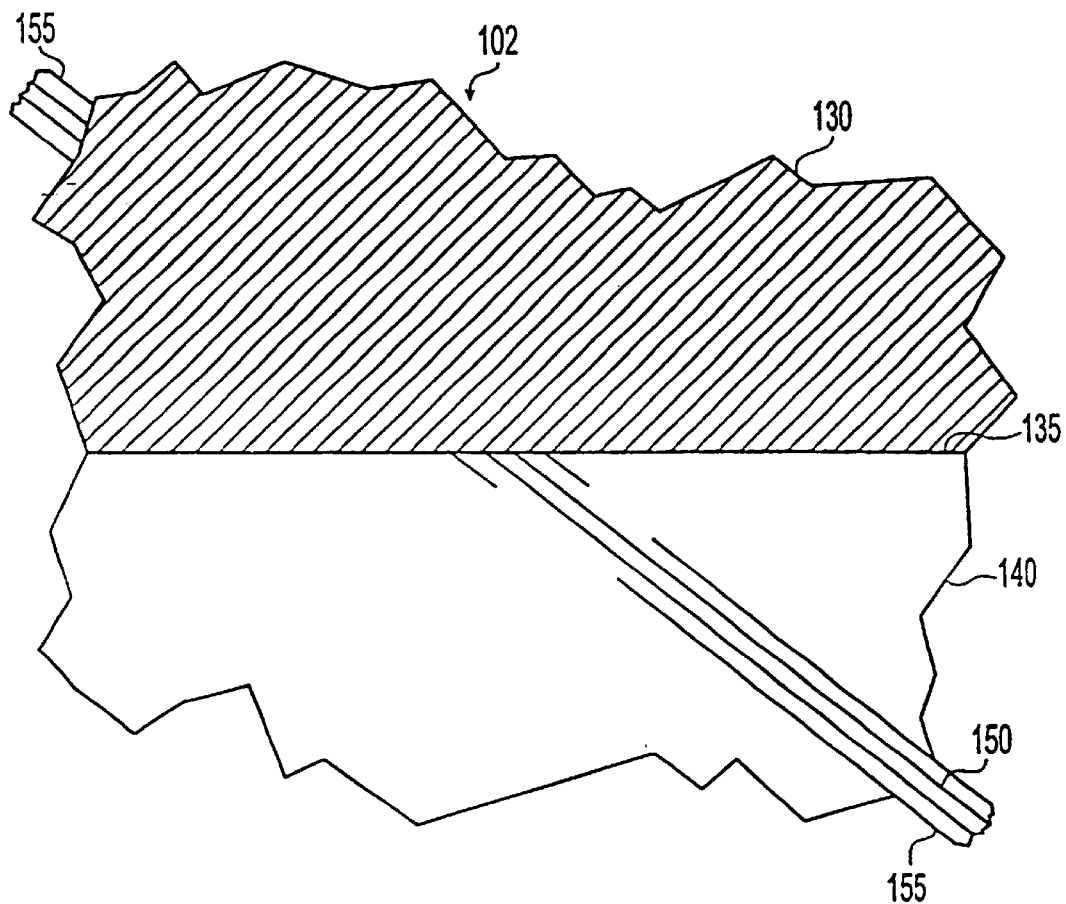
FIG. 4 shows the substrate of an optical switch MEMS device.

FIG. 1 shows an isometric view of the general configuration of a MEMS switch or valve device 100 in accordance with the present invention. The device 100 includes a substrate 102 having a surface 104. A moving or switching element 106 has a generally flat main portion is disposed in parallel to the substrate 102, above the surface 104. As described in detail below, moving element 106 may also have support wings, legs or other appendage-like members that are connected to the main portion of element 106 (not shown in FIG. 1). A cross-sectional view of the device 100 taken along the line 1A—1A in FIG. 1 is shown in FIG. 1A. Referring to FIGS. 1 and 1A, the main portion of moving element 106 has a first major surface 108 facing away from substrate 102 and a second major surface 110 that faces substrate 102, and more specifically surface 104 of substrate 102.

As shown, moving element 106, or more specifically the main portion thereof, is preferably separated from substrate 102 by a short distance h. As described in detail below, when device 100 performs a switching or actuation operation, element 106 is selectively moved to a different operative position in the horizontal plane located a distance h above substrate 102. While moving between operative positions in the horizontal plane, i.e. during actuation, moving element 106 may temporarily leave the horizontal plane. Furthermore, moving element 106 may be located on the surface 104 of substrate 102 above an aperture therein (i.e. h may equal zero), moving element 106 may be recessed within an aperture of substrate 102 (i.e. h may be slightly negative), or moving element 106 may be located on the other side of substrate 102 (i.e. h may have a relatively large negative value). In all embodiments, however, moving element 106 is disposed horizontally or in parallel to substrate 102.

MEMS device 100 is particularly suitable for use as an optical switch or valve in a fiber optic communication network, however the advantages of MEMS device 100 of the present invention may also be exploited in many other applications. For example, device 100 may be used as a conveyor, an acoustic wave switch with moving element 106 being an acoustic wave mirror or absorber. When used as an optical switch, moving element 106 is used to selectively reflect, diffract, refract, collimate, absorb, attenuate, or otherwise alter or modulate the properties and/or path of a light beam. Consequently, moving element 106 may be an optical mirror, modulator, lens, collimator, attenuator, filter, or absorber for example. In particular, when MEMS device 100 is an optical switch, moving element 106 may preferably be a reflective mirror.

As shown in the embodiment of FIG. 2, moving element 106 may be rectangular and may move in a linear direction within a travel path, defining a range of travel, in the horizontal plane. For example, element 106 may have a travel path along the line defined by arrows 112 or the line defined by arrows 114. More generally, moving element 106 may move in any linear direction within the horizontal plane. In an alternate embodiment shown in FIG. 3, the moving element may be sector-shaped, as shown at 116, and may move in a radial or pendulum-like motion about a point 120, as shown by arrows 118. As a further alternative, the motion of element may 106 may be a combination of rotational and translational motion. As indicated, the main portion of moving element 106 is generally flat but otherwise may be of a shape other than those shown in FIGS. 2 and 3, such as circular or elliptical.

Substrate 102 is a semiconductor wafer substrate which may be fabricated using well known integrated circuit processing techniques. The substrate is preferably silicon based, but other materials such as glass, polymers, or metals may also be used. An actuator, which may comprise microelectronic components, is preferably built in or on substrate 102 and serves to actuate the desired movement of moving element 106, as described in detail below. Substrate 102 is preferably produced with atom smooth surfaces and a high degree of parallelism and linearity. As shown in FIG. 4, in the case of an optical switch, substrate 102 may include a first zone 130 through which light 150 from an optical fiber 155 does not penetrate, and a second zone 140 which is transparent to light beam 150. A baseline 135 separates the zones 130 and 140. The switching or actuation of element 106 preferably occurs at least partially above the second zone 140, and in a direction parallel to or perpendicular to baseline 135. The second zone 140 may, for example, comprise a transparent glass. Alternatively, the substrate may simply be absent in zone 140, as long as sufficient structural support for device 100 is otherwise provided. For instance, zone 140 may be a hole or aperture etched through substrate 102, and which is surrounded by zone 130 (e.g. see FIG. 8A). Generally, the zones 130 and 140 may be located on substrate 102 in any number of ways, and it is also possible for substrate 102 to have more than one zone 130 and/or zone 140 which are not contiguous. For example, two non-penetrable substrate zones 130 may be separated by a single penetrable zone 140. As a further alternative all of substrate 102 may comprise an optically transparent material such as glass.

Figure 5:
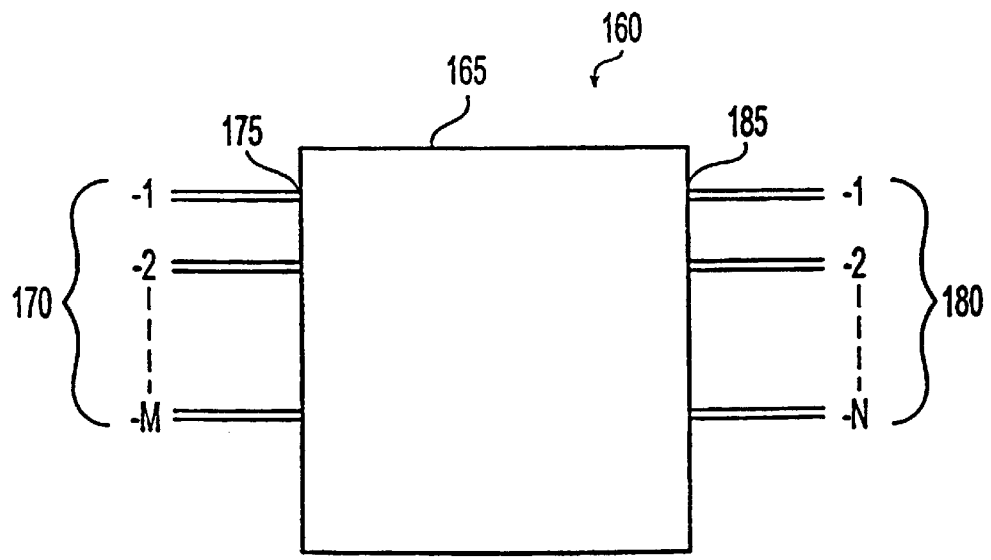
FIG. 5 shows a MEMS optical cross connect switch.

As shown in FIG. 5, when device 100 is configured as a MEMS optical cross connect switching device 160, it may have a support structure 165 which receives M input optical fibers 170 at corresponding input ports 175 on structure 165, and outputs N optical fibers 180 at corresponding output ports 185 on structure 165. Fibers 170 and 180 may, for example, be standard 125 μm fibers, and each of N and M may be greater than or equal to 1. Any support structure 165 is preferably integrated with substrate 102, and is at least connected thereto. Where the medium of switch 160 is a vacuum or contains an inert gas, support structure 165 is a closed structure. To minimize dispersion of the light outside the confinement of the optical fibers, fibers 170 and 180 are carefully aligned and also placed as close as possible to the moving element of the switch without affecting or impeding the movement of that element.

FIGS. 6A–6D illustrate the operation of device 100 as a 1×1 (ON/OFF) optical switch 200. FIGS. 6A and 6B show the switch 200 in a first or ON position in which light beam 150 exits input fiber 170, travels through zone 140 of substrate 102, and re-enters output fiber 180, unaffected by the moving element 106 of switch 200. FIG. 6B is a top view of switch 200 along the direction of arrows 6B—6B in FIG. 6A. As described above, light 150 passes through the penetrable zone 140 of substrate 102 before entering output fiber 180 as shown in FIGS. 6A and 6B. FIGS. 6C and 6D show the switch 200 in a second or OFF position in which moving element 106 has moved, parallel to substrate 102, into the path of light 150 so that light 150 is now incident thereupon. FIG. 6D is a top view of switch 200 along the direction of arrows 6D—6D in FIG. 6C. Since switch 200 is functioning simply as an on/off switch and since the light 150 is directly or normally incident on moving element 106 (i.e. has an angle of incidence of 0° in the OFF position), in this embodiment moving element 106 is preferably an optical absorber that takes up and dissipates the light 150 when in the OFF position (as opposed to a mirror that would reflect light 150 back into input fiber 170 when in that position).

FIGS. 7A and 7B illustrate the operation of device 100 as a 1×2 (single-pole double-throw or SPDT) optical switch 210 in which moving element 106 is preferably a mirror. In FIG. 7A, moving element 106 is in a first position and light 150 from input fiber 170 travels into a first output fiber 180-1. When moving element 106 is translated, parallel to substrate 102, to a second position shown in FIG. 7B, light 150 from input fiber 170 reflects off of the surface of mirror 106 and is directed into a second output fiber 180-2. In the second position of mirror 106 shown in FIG. 7B, light 150 is not normally incident upon the surface of mirror 106 but rather has an angle of incidence (i.e. the angle between the normal to the mirror surface and the light) that is greater than zero. In a preferred embodiment, the angle of incidence of the light 150 is about 45°. As will be appreciated by those skilled in the art, when switch 210 is actuated from one position to the other, the integrity of the information contained in the light output to fiber 180-1 or 180-2 will only be reliable once the switching operation is complete, and all of the light from input fiber 170 travels into either output fiber 180-1 or output fiber 180-2. As a result, having a fast switching speed for switch 210 is clearly advantageous and desirable.

Switch 210 of FIGS. 7A and 7B could be converted into a 1×1 (ON/OFF) switch by, for example, replacing either the output fiber 180-1 or the output fiber 180-2 with an optical absorber. In addition, in FIGS. 6A–6D, Light 150 may also optionally be directed at the horizontal plane in which element 106 moves at an angle of incidence that is greater than zero (e.g. 45°), as in FIGS. 7A and 7B.

Figure 8A:
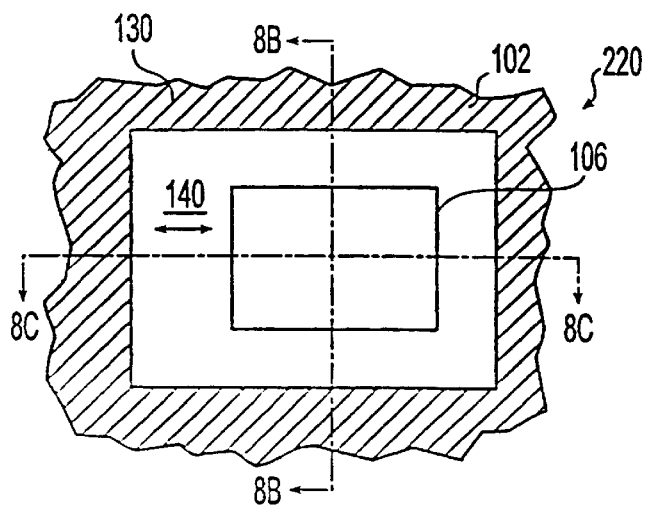
FIGS. 8A–8D illustrate another embodiment of a 1×2 optical switch.
Figure 8B:
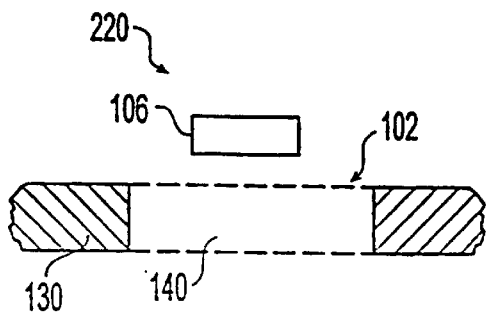
Figure 8C:
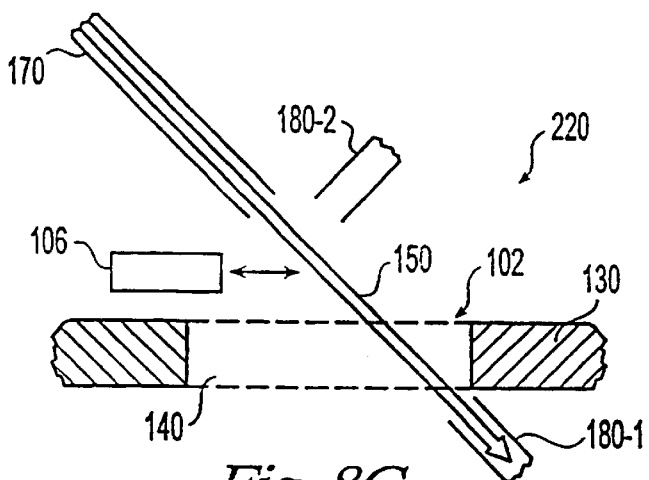
Figure 8D:
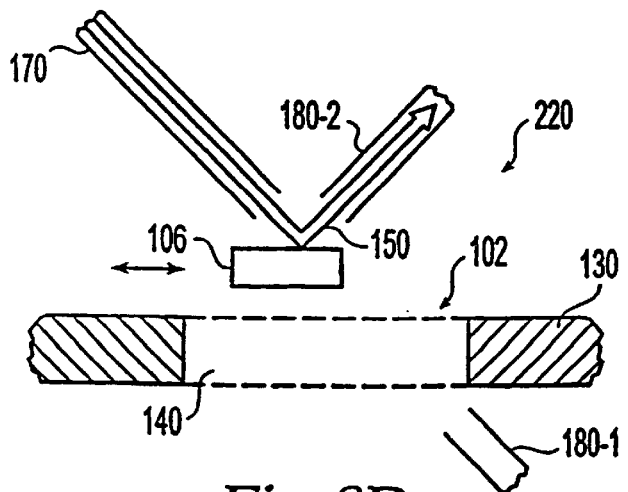

FIGS. 8A–8D illustrate another embodiment of a 1×2 optical switch 220 in which non-penetrable zone 130 of substrate 102 surrounds a light penetrable (i.e. transparent) zone 140 of substrate 102. FIG. 8A shows a top view of the switch 220, FIG. 8B shows a cross-sectional view along the line 8B—8B in FIG. 8A, and FIG. 8C (and FIG. 8D) shows a cross-sectional view along the line 8C—8C in FIG. 8A. In this embodiment of the invention, the moving element 106 is a mirror, and the mirror's movement in the horizontal plane is entirely above the penetrable zone 140. Alternatively, when zone 140 is a free space hole or aperture in substrate 102, moving element 106 may be located within zone 140, e.g. moving element 106 may be flush with the surface 104 of substrate 102. Also, especially when zone 140 is an aperture in substrate 102, the actuator (not shown in FIGS. 8A–8D) for switch 220 is preferably located in or on zone 130 of substrate 102, and any support structure for switch 220 is connected to zone 130. As shown in FIG. 8C, with the moving element 106 in a first position, light 150 from input optical fiber 170 travels through zone 140 into first output fiber 180-1. On the other hand, with the moving element 106 in a second position, shown in FIG. 8D, light 150 from input fiber 170 is incident at an angle to the surface of mirror 106, reflects off that surface, and is redirected into second output fiber 180-2.

Figure 9A:
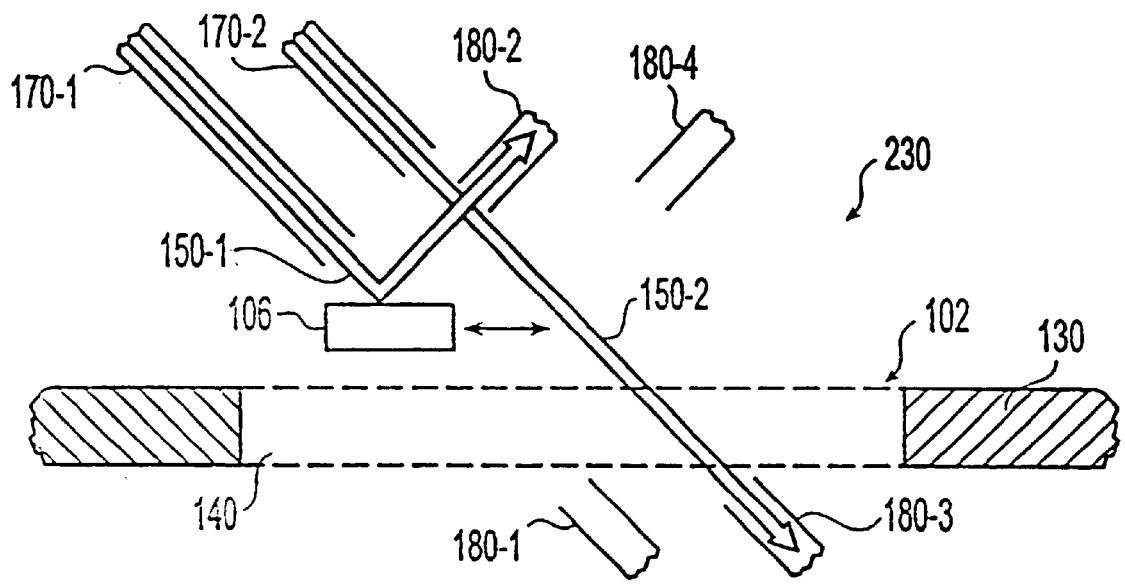
FIGS. 9A and 9B illustrate an adaption of the 1×2 switch of FIGS. 8A–8D to form a (1×2)×2 switch.
Figure 9B:
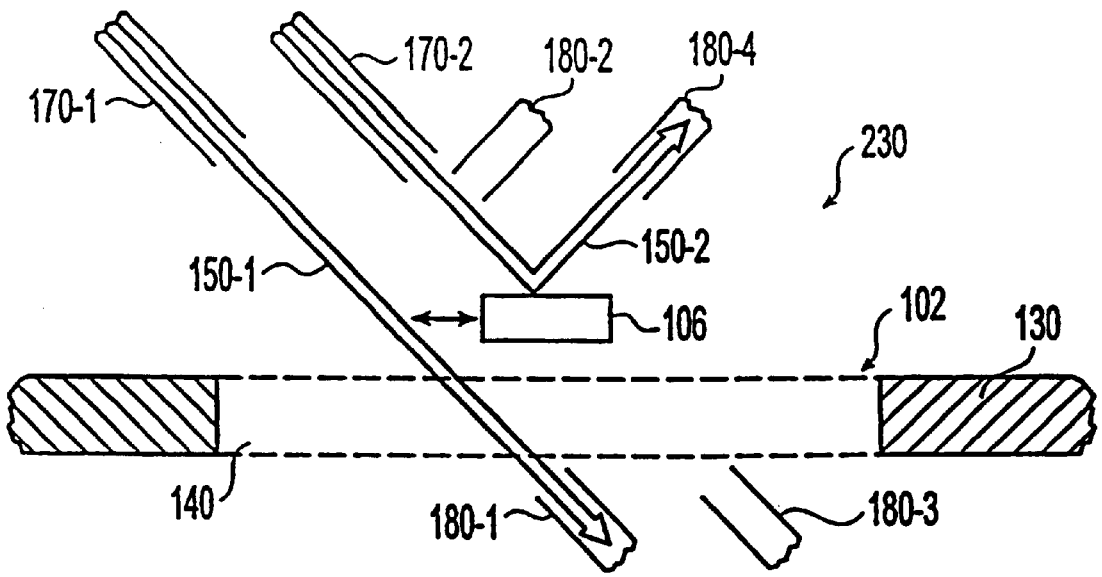

FIGS. 9A and 9B illustrate an adaption of the 1×2 switch 220 of FIGS. 8A–8D to form a (1×2)×2 switch 230. As shown, switch 230 includes two input optical fibers 170-1 and 170-2 carrying light beams 150-1 and 150-2 respectively. Light beams 150-1 and 150-2 preferably travel in parallel to one another as they exit their respective fibers 170-1 and 170-2. Switch 230 also includes four output optical fibers 180-1 to 180-4. Moving element 106 of switch 230 is again preferably a mirror. FIG. 9A shows moving element 106 in a first position in which light 150-1 from input fiber 170-1 reflects off of mirror 106 and is redirected into output fiber 180-2, and in which light 150-2 from input fiber 170-2 travels, unobstructed, through substrate zone 140 and into output fiber 180-3. When moving element 106 is in a second position, shown in FIG. 9B, light 150-2 from input fiber 170-2 reflects off of mirror 106 and is redirected into output fiber 180-4, and light 150-1 from input fiber 170-1 travels through substrate zone 140 and into output fiber 180-1. By, for example, replacing output fibers 180-2 and 180-4 with optical absorbers, switch 230 may be converted into a 1×1 (ON/OFF)×2 switch, in which one and only one of the light beams 150-1 and 150-2 is transmitted through switch 230.

It should be noted that the light beams may travel through any of the switches described above in the reverse direction to that illustrated, that is with the input and output fibers reversed. For this purpose, where moving element 106 is a mirror, either one or both of surfaces 108 and 110 of element 106 (see FIG. 1) may be reflective.

As described above, moving element 106 of MEMS device 100 operates in at least a first position and a second position to provide, for example, a switching function. A moving element may also operate to perform a switching function in more than two positions. The present invention may use a number of different types of actuation approaches for selectively changing the position of each moving element 106 in device 100. Generally, the actuator transforms electrical or thermal energy into controllable motion (as indicated above, at least part of the actuator is preferably located in or on substrate 102). The preferred actuation approach may depend on the type of moving element used. In particular, the actuator may be based on the following types of actuation principles: thermomechanical; shape memory alloys (SMA) with thermal actuation; electromagnetic; electrostatic; or piezoelectric (other actuation principles such as those based on magnetic, diamagnetic, mechanical, or phase change principles may also be used).

These microactuation principles are well known in the art: see generally R. G. Gilbertson et al, "A survey of Micro-Actuator Technologies for Future Spacecraft Missions", *Practical Robotic Interstellar Flight: Are We Ready? Conference,* New York, (August–September 1994), the contents of which are incorporated herein by virtue of this reference. Briefly, thermomechanical actuation is based on the physical expansion or contraction that occurs in materials when they undergo temperature variations. Shape memory effect actuation is based on changes in material properties that arise in some metal alloys (such as nitinol) when they are cycled above or below a certain transition temperature. SMA effect shape changes are generally much greater and occur over a much smaller temperature range compared to thermal expansion/ contraction. Both these types of thermally driven actuators require cooling, either passive or active, to reverse their actuation action.

Electromagnetic actuation is based on electric current moving through a conducting material. Advantages of electromagnetic actuation include the very rapid generation of forces and operation which is relatively independent of temperature. However the efficiency of electromagnetic actuation decreases significantly on the micro-scale, and it may be difficult to fabricate and appropriately position small electromagnetic coils in a MEMS device. Electrostatic actuation is based on the attraction of oppositely charged objects and repulsion between similarly charged objects. Electrostatic forces also arise very rapidly and are relatively temperature-independent. Electrostatic actuation is also highly efficient over small distances. Piezoelectric actuation is based on the mechanical force and motion that arise from the dimensional changes generated in certain crystalline materials when subjected to voltage or charge. Typical piezoelectric materials include quartz, lead ziconate titanate, and lithium niobate. Piezoelectric materials respond very quickly and with high forces to changes in voltage potentials.

Generally, the actuator should provide for stable and accurate positioning of the moving element 106 at each of its operative (or stable state) positions, such as at the two end points within the range of travel of element 106. In addition to using one of the above mentioned actuation principles to move the element 106 from one operative position to another, the same or a different principle may be used to maintain the moving element in one of its stable states. Preferably, electrostatic means are used to hold the moving element in its desired position as described in connection with FIG. 11 below.

FIGS. 10A–10D show a first possible actuator 250 for the MEMS device 100 of the present invention based upon the inducement of elastic (or stress) waves in an elastic material or membrane 260 placed on the surface 104 of substrate 102. By releasing strain energy, a solid elastic material changes its shape and size under the action of opposing forces, but recovers its original configuration when the forces are removed. An elastic wave propagates through the elastic material when displaced particles transfer momentum to adjoining particles, and thereafter the momentum-transferring particles are themselves restored to their original position.

Figure 10A:
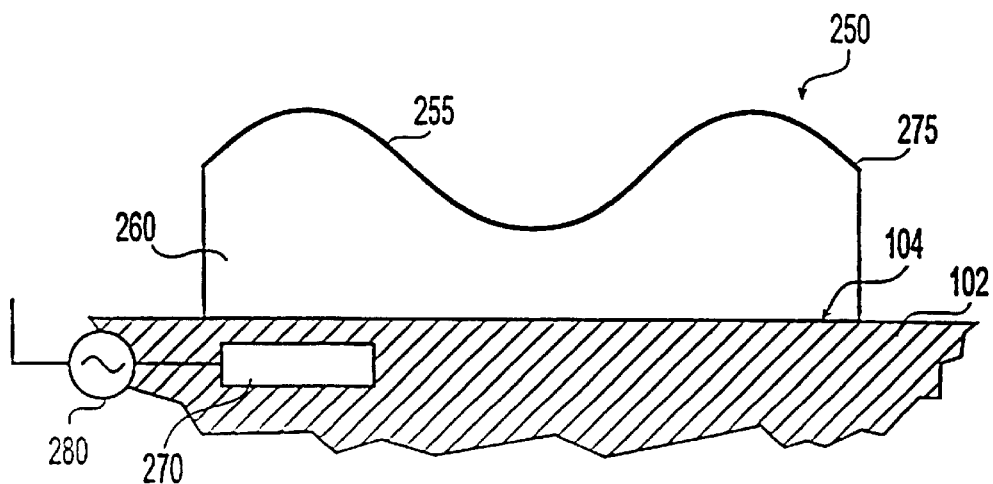
FIGS. 10A–10D show a preferred actuator for the MEMS device of the present invention based upon the inducement of elastic or stress waves in an elastic material.

A standing elastic wave 255 may be induced by any of the above-described actuation principles capable of producing a modification to the dimensions of the elastic membrane 260, including thermal expansion (thermomechanical), piezoelectric, magnetic, or electrostatic. In the preferred embodiment of FIGS. 10A–10D, electrostatic actuation is used. An electrode 270 is placed on or in substrate 102, preferably underneath surface 104 as shown in FIG. 10A. By applying a voltage difference between electrode 270 and another ground reference electrode 275 placed on the top surface of elastic material 260, a vibration in the material 260 is produced. Electrode 275 is also made of a elastic material. A cyclic or standing wave motion 255 may be generated by applying an appropriate AC electrical signal 280, e.g. an AC voltage signal, between the electrodes 270 and 275.

Figure 10B:
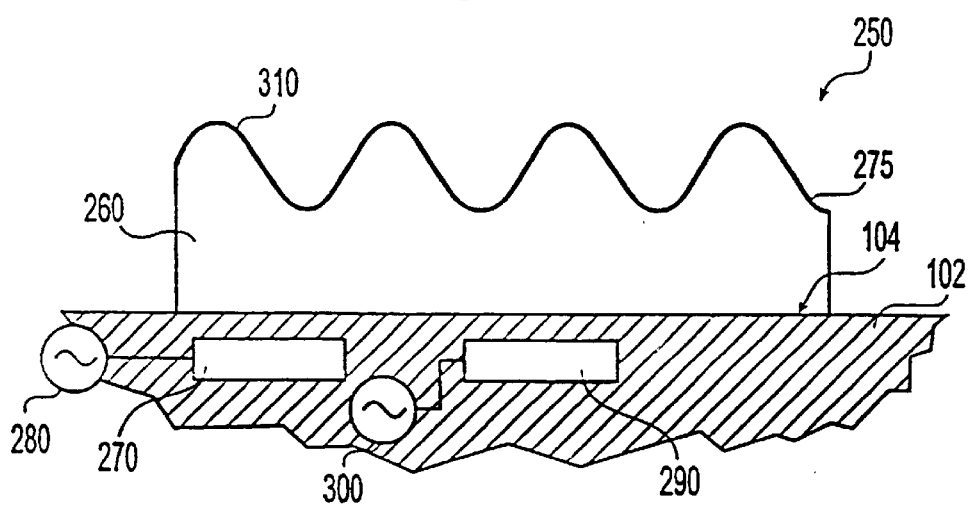
Figure 10C:
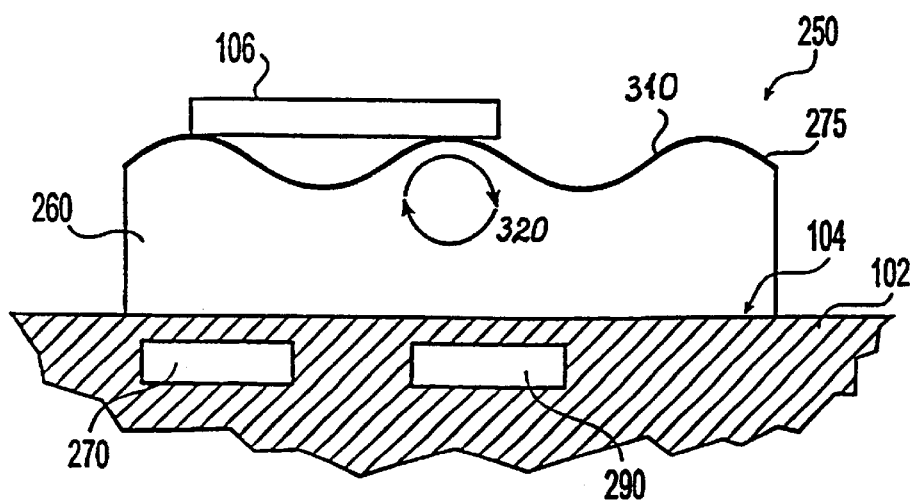
Figure 10D:
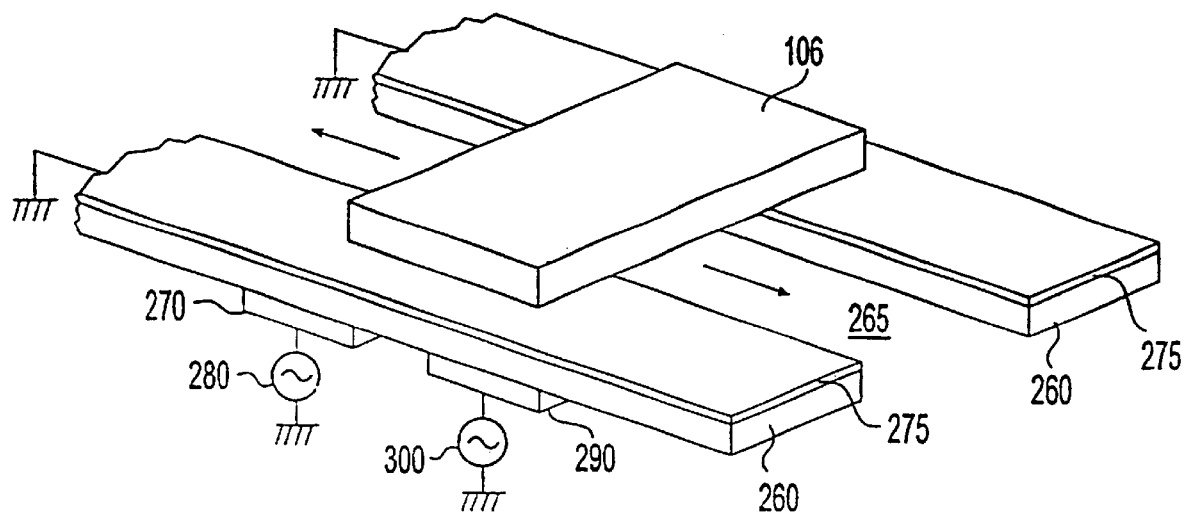

In FIG. 10B, a second substrate electrode 290 is also included in substrate 102 underneath surface 104. Another AC electrical signal 300, preferably an AC voltage signal, is provided across electrodes 290 and 275. By having a constant phase difference between the signals 280 and 300 a travelling wave 310 is produced on the surface of elastic material 260 (and hence on electrode 275). As shown in FIG. 10C, due to travelling wave 310, a point on the surface of elastic material 260 (and the corresponding point on the surface of electrode 275) undergoes a cyclic or periodic motion 320. This motion 320 serves to move or actuate moving element 106 when it is placed on top of electrode 275 and elastic material 260. By changing the phase difference between signals 280 and 300, the speed and direction of the travelling wave 310 may be selectively adjusted, and correspondingly so can the speed and direction of moving element 106. Furthermore, as will be appreciated by those skilled in the art, microelectronic circuitry for providing the AC electric signals 280 and 300 can be readily provided in or substrate 102 using standard integrated circuit fabrication techniques.

In the case of an optical switching device, electrode 275 is preferably comprised of a material that is transparent to light. Alternatively, as shown in the isometric view of FIG. 10D, the elastic material 260 may be provided in two segments separated by a hole or gap 265. Each segment of elastic material 260 includes an electrode 275 on the top surface thereof Preferably, in the embodiment of FIG. 10D, the penetrable zone 140 of substrate 102 (not shown in FIG. 10D) lies beneath gap 265.

For the actuator 250 to move element 106, moving element must be held on to the elastic material 260 on which the wave 310 propagates, i.e. through contact and friction. In prior art MEMS devices, the moving element is generally attached to an actuator by way of weight, springs, or clamps which during actuation of the MEMS produce considerable dynamic friction and wear, eventually resulting in reduced reliability. On the other hand, in the present invention, the moving element 106 is preferably "attached" to the actuator by means of a magnetic and/or electrostatic force.

For example, in one embodiment of the present invention, the moving element 106 may be made of a magnetic material, with the surrounding parts of the actuator and/or the substrate (below elastic material 260) also comprising a reversely polarized magnetic or ferromagnetic material. As a result, an attractive magnetic force appears between moving element 106 and the substrate and/or actuator. The magnetic force induces static friction and holds or attaches element 106 to the surface 265 of elastic material 260. The attachment of moving element 106 can be made sufficiently strong so that the device 100 functions even when oriented against the direction of gravity, allowing MEMS device 100 to operate in any desired orientation.

Figure 11:
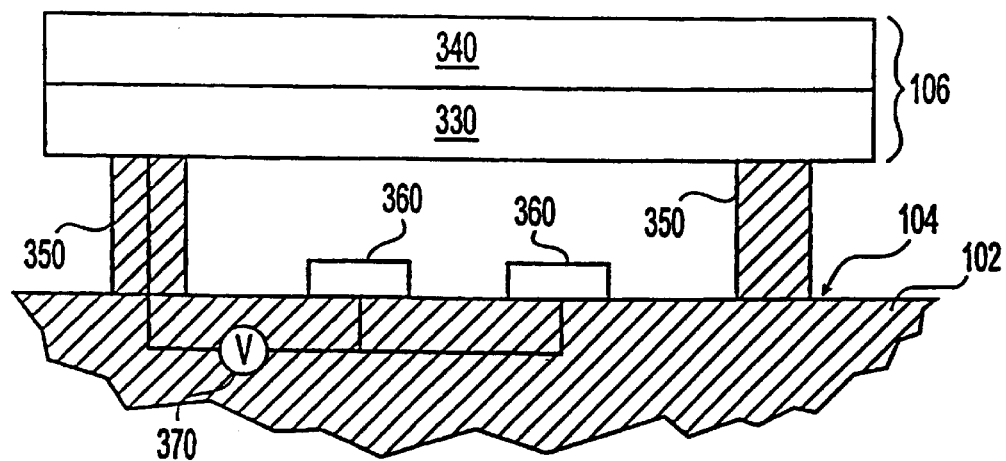
FIG. 11 shows a preferred configuration for holding the moving element to the actuator of the device.

Alternatively, the magnetic material in either moving element 106 or the substrate/actuator can be replaced with electromagnets. A further preferable attachment technique, illustrated in FIG. 11, provides an electrostatic attraction between moving element 106 and the substrate, actuator, and or support structure (i.e. the fixed components) of device 100. As with the reversely polarized magnetic materials, oppositely charged electrostatic materials produce a force that induces static friction, holding element 106 to the surface 265 of elastic material 260 and permitting the actuator to function. This attachment embodiment is illustrated in FIG. 11, in which moving element 106 comprises a conductive component 330 and a functional component 340 (e.g. a mirror or an optical absorber). If necessary, components 330 and 340 of moving element 106 may be separated by an additional insulating layer. Optionally, element 106 can comprise a single component of a material capable of providing both the conducting and the desired optical function.

As shown in FIG. 11, moving element 106 rests on two posts 350 located on top of substrate surface 104. Posts 350 may be formed by etching within the substrate 102 or may be deposited on top of substrate 102 during fabrication, for example. An elastic material may be deposited between posts 350 or, alternatively, posts 350 may comprise elastic material 260 in which a travelling wave is generated, for example as described in connection with FIG. 10D above. As a further alternative, posts 350 may be actuating beams as described in detail below in connection with other actuator embodiments.

Referring still to FIG. 11, two electrodes 360 are also located on top of substrate surface 104 (alternatively electrodes 360 may be located underneath or within surface 104). Although electrodes 360 are shown to be positioned between posts 350, they may generally be positioned anywhere along surface 104 as long as they are at least approximately underneath moving element 106 (for instance, electrodes 360 may be positioned outwardly of posts 350 in FIG. 11). By applying, for example, suitable voltage difference 370, the conducting component 330 can be made more positively charged and substrate electrodes 360 more negatively charged (or vice versa), resulting in an electrostatic field that maintains moving element 106 against posts 350. For example, conducting component 330 can be charged to a voltage above a certain reference level (i.e. ground), and substrate electrodes 360 can be charged to a voltage below that reference level. Signal 370 can again be provided by suitable microelectronic circuitry located in or on substrate wafer 102. In an alternative embodiment, fixed electrodes 360 are oppositely charged by connecting a potential difference between them. Localized charges are thereby induced on conducting component 330 so that element 106 is electrostatically sustained and attached to posts 350.

Again, it should be noted that the upper direction in FIG. 11 is not necessarily against the direction of gravity, and the device 100 can be positioned in any orientation, with the electrostatic force between electrodes 360 and conducting component 330 providing a "virtual gravity" effect on moving element 106. A further advantage of the attachment configuration of FIG. 11 is the absence of a direct electrical contact between moving element 106 and the substrate electrodes 360. Additionally, moving element 106 is not restricted to particular connecting points, and the attachment force provided by the potential difference 370 can be adjusted as desired. As a result, this preferred attachment mechanism for element 106 permits device 100 to function in any orientation, without relying on gravity and without requiring the use of springs (or other connection components) that may produce dynamic friction during actuation, resulting in wear, or the use of bearing-like parts that are difficult to fabricate in micro dimensions.

In the alternative to travelling elastic wave actuator 250 of FIGS. 10A–10D, other types of actuators may also be used in MEMS device 100 of the present invention. In one preferred implementation, the actuator may comprise a number of independently controllable (or actuable) members for selectively engaging moving element 106. Each member preferably has a base end connected to substrate 102 an another free end or tip that is selectively or operatively engageable with moving element 106. The members, or their free ends, may be controllably moved by way of any one of the actuation principles mentioned above (e.g. electrostatic, piezoelectric, thermomechanical, etc.) to carry moving element 106 in a desired direction. In doing so, the actuator members may engage moving element 106 in succession or simultaneously depending on the specific details of actuator operation.

Figure 12:
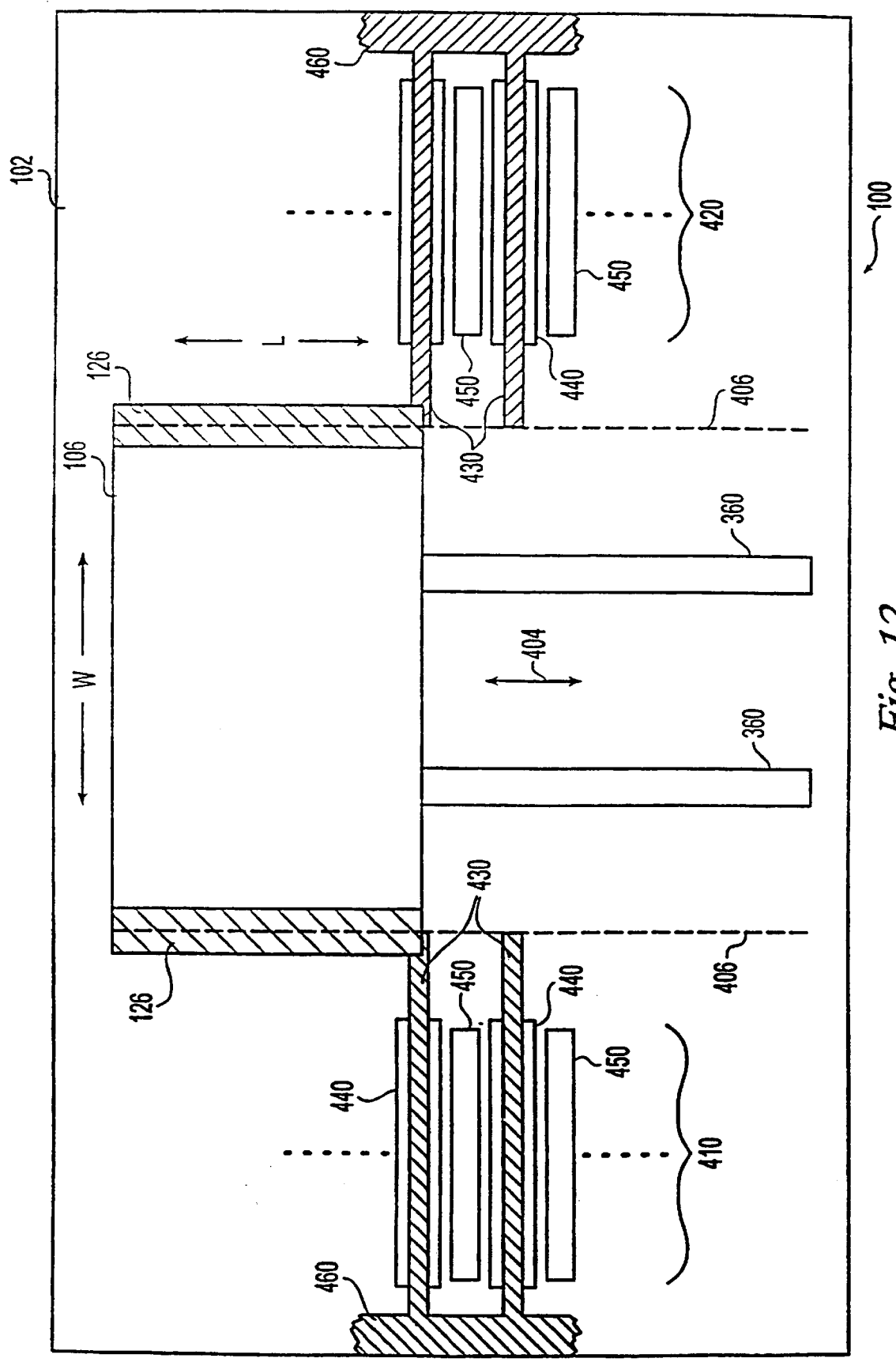
FIG. 12 is a top plan view of the MEMS device of the present invention comprising another preferred actuator that uses actuating beams.

For example, FIG. 12 shows a top plan view of a preferred configuration of MEMS device 100 having an actuator 400 having two sets 410 and 420 of actuating beams 430. Beams 430, which act as fingers or cantilevers, are generally elongated, and preferably of a rectangular or square cross-section, at least near the tips thereof Each set 410, 420 comprises a number of beams 430, although, for clarity of illustration in FIG. 12, only two beams 430 are shown in each of sets 410 and 420. However, the presence of additional beams is intended to be indicated by the ellipses, as shown, so that, in general, beams 430 extend along substantially the entire travel path of element 106, preferably near the edge or side of that path. The line of travel of element 106 is represented by the double-headed arrow 404, and the associated travel path of moving element 104 has edges at 406, as shown in FIG. 12. For example, in one preferred embodiment moving element 106 is of 300 $\mu$m in length (L), 300 $\mu$m in width (W), and about 2 $\mu$m in thickness and travels a horizontal distance of about 300 $\mu$m between operative positions (e.g. ON and OFF positions for an optical switch). For the exemplary dimensions, each set 410, 420 of actuating beams may have between 15–20 equally spaced apart beams 430, each having a length of 150 $\mu$m and a 2 $\mu$m by 2 $\mu$m cross-section. However, any number of beams of different shapes and sizes may be used, depending on the size and application of device 100 and element 106, and the above example is in no way intended to be restrictive.

Figure 14A:
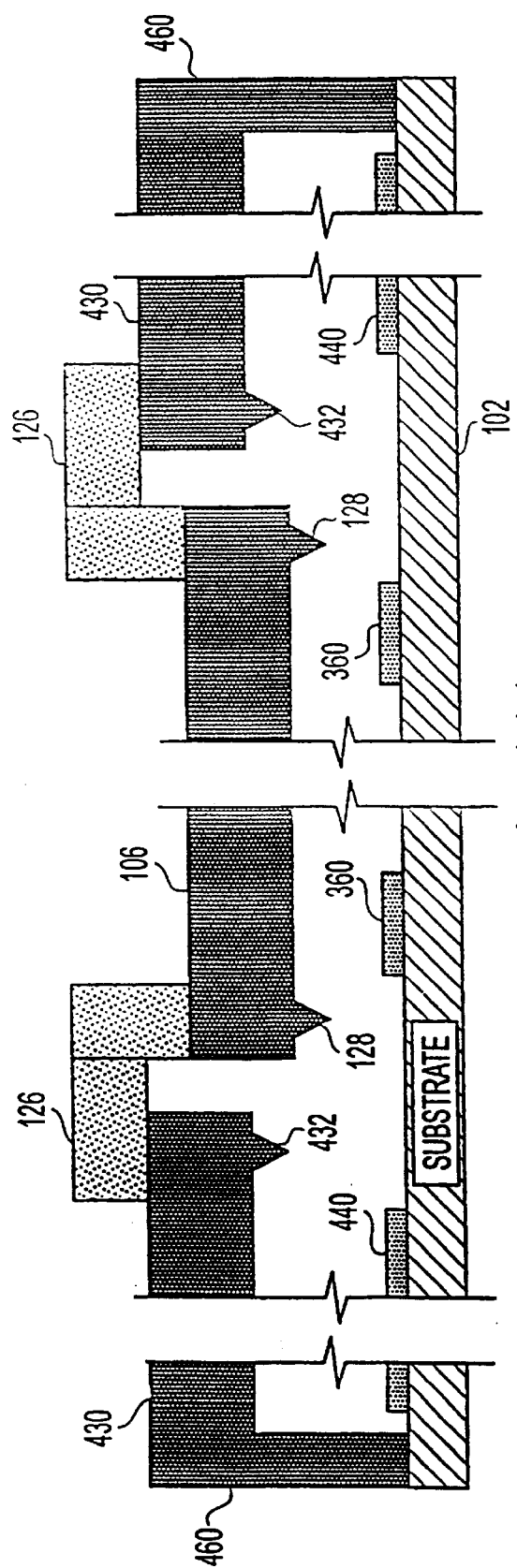
FIGS. 14A–14B show cross-sectional side views of the device and actuator of FIG. 12.
Figure 14B:
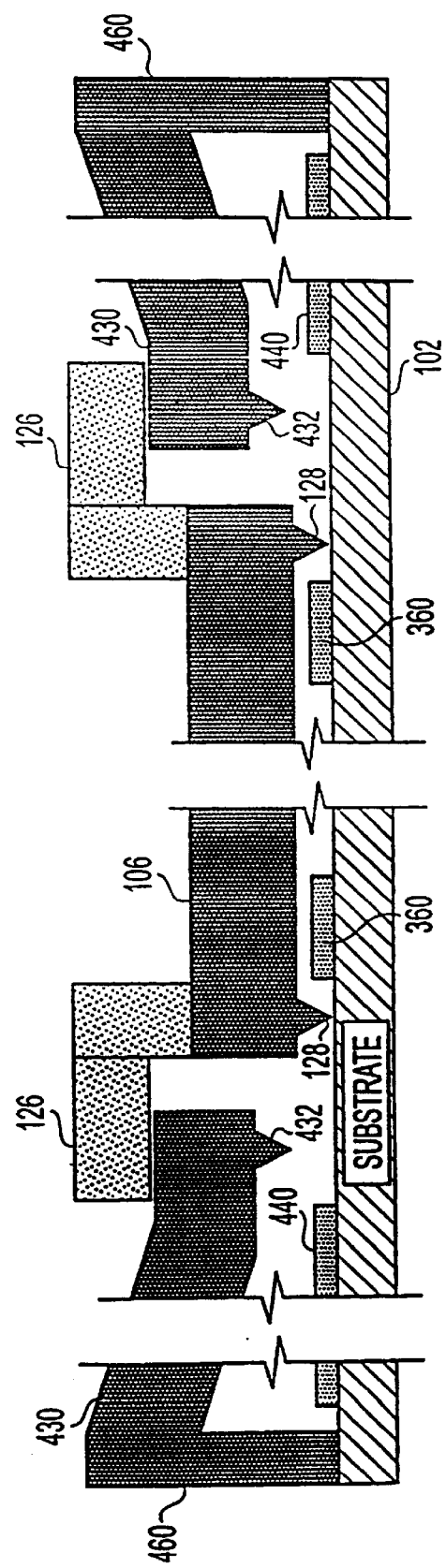

As shown in the top plan view of FIG. 12, and more clearly in the cross-sectional side views FIGS. 14A–14B, moving element 106 preferably includes wings 126 extending perpendicular to the line of travel of element 106 from opposite ends thereof Each wing 126 is supported by a subset of the beams 430 in set 410 or set 420. At different positions within its range of travel (i.e. along its travel path), element 106 is supported by different subsets of beams 430. By actuating the beams 430, or more specifically the distal ends or tips of beams 430, in a systematic and controlled manner, element 106 is moved in a desired direction. Electrodes 360 located in or on substrate 102 serve to hold or attach element 106 in place. For this purpose, element 106 may include a conductive component as described in connection with FIG. 11 (but not shown in FIG. 12). Where MEMS device 100 is an optical switch, the portion of substrate 102 between electrodes 360 may be penetrable, i.e. transparent, to light, as described above in connection with FIG. 4.

In each set 410, 420, the base end of each beam 430 is preferably connected to a single anchor or base portion 460 on substrate 102. Alternatively, however, the base of each beam 430 may be connected to an individual anchor portion that is separately connected to substrate 102. Other configurations may also be used to rigidly fix the base of each actuating beam 430 with respect to substrate 102. As shown in FIGS. 14A–14B, moving element 106 may include fin-like legs 128 extending toward substrate 102, and similarly, each beam 430 may include a fin like leg 432 at the tip of the beam (i.e. the end of the beam away from base portion 460) also extending toward substrate 102. These legs ensure that there is no physical contact between beams 430 or moving element 106 and the electrodes on the surface 104 of substrate 102 (or substrate 102 itself). Legs 128 and 432 thereby serve to avoid any stiction, but may be omitted if this is not a concern.

Figure 13A:
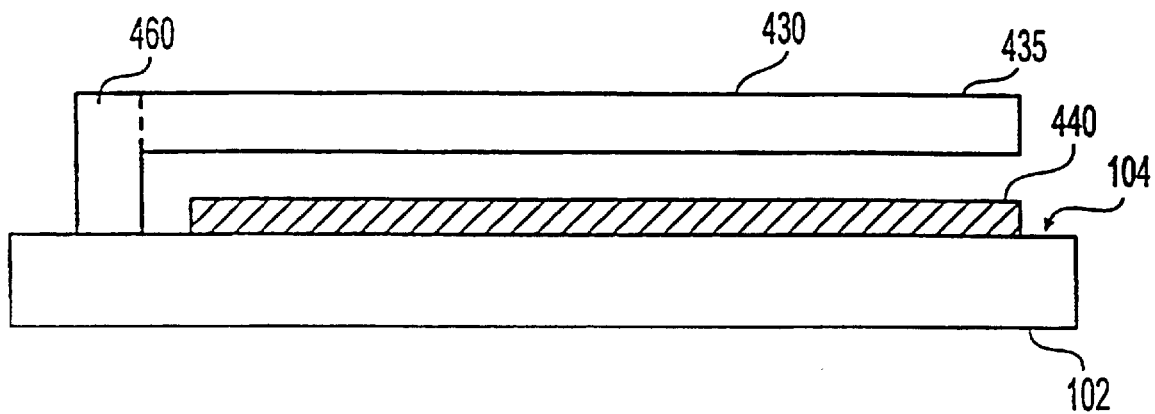
FIGS. 13A–13B illustrate the relative positioning of an actuating beam and corresponding electrodes for electrostatically actuating the beam.
Figure 13B:
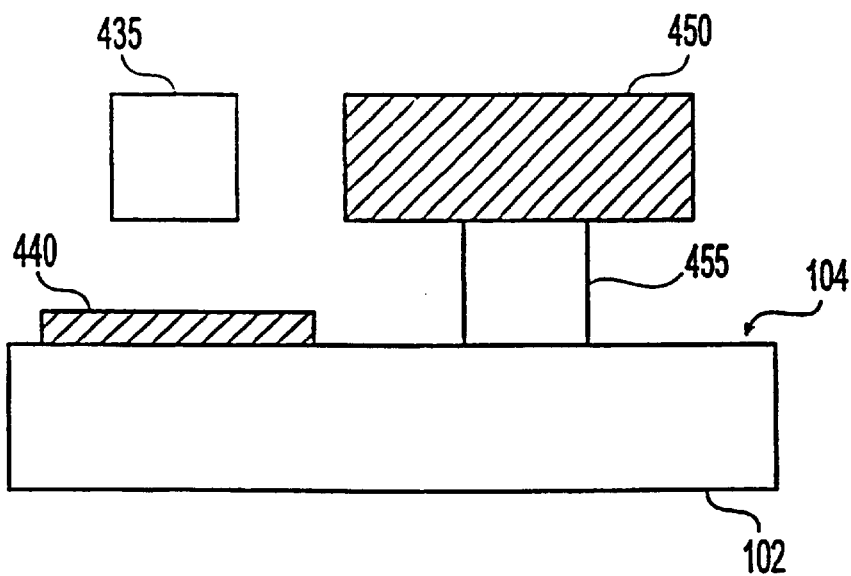

Beams 430 may be actuated by any suitable actuation principle, however, electrostatic actuation is preferably used, and therefore actuating beam 430 are preferably conductive. As illustrated in FIG. 12, to provide electrostatic actuation, each beam 430 has a bottom electrode 440 and a side electrode 450 associated therewith. The corresponding bottom electrode 440 preferably lies along substrate 102, underneath each beam 430, as is shown in FIGS. 13A–13B. FIG. 13B further illustrates the positioning of a corresponding side electrode 450 for each actuating beam 430. Side electrode 450 preferably includes a support 455 so that side electrode 450 is generally at the same height as beam 430 with respect to the surface 104 of substrate 102. The tip of the actuating beam can be actuated away from substrate 102 by making both the beam 430 and bottom electrode 440 more positively (or negatively) charged than a reference. Conversely, the tip of the actuating beam can be actuated towards substrate 102 by making one of beam 430 and bottom electrode 440 more positively charged than a reference and the other more negatively charged than the reference. Similarly, the tip of the actuating beam can be actuated in the direction towards side electrode 450 by making one of beam 430 and side electrode 450 more positively charged than a reference and the other more negatively charged than the reference; while by making both beam 430 and side electrode 440 more positively (or negatively) charged than a reference, the tip of the actuating beam can be actuated in the direction away from side electrode 450. As will be appreciated by those skilled in the art, integrated circuitry for generating the above described electrostatic forces, for example using voltage pulse signals, may be readily and conveniently provided in substrate 102. Furthermore, to provide the desired actuation of beams 430, electrodes could be positioned at both sides of an actuating beam, and it is also possible to provide an electrode above each actuating beam 430 (in addition to or instead of bottom electrode 440).

As illustrated in FIGS. 12 and 13A–13B, corresponding bottom and side electrodes 440 and 450 preferably extend in parallel along a considerable portion of each beam 430. The stress in beams 430 is low during actuation since only relatively small displacements are required. Also, the tips of beams 430 preferably remain generally parallel to the surface 104 of substrate 102, as illustrated by FIG. 14A which shows a cross-sectional side view of the MEMS device of FIG. 12 with opposing beams 430 in an unactuated position and FIG. 14B which shows the same cross-sectional side view with the opposing beams 430 in actuated towards substrate 102. Furthermore, it should be pointed out that a side electrode 450 is generally positioned in close proximity to its corresponding beam 430, while being far enough way from the next closest beam 430 so that any electrostatic force between the side electrode 450 and the next closest beam is negligible. In this manner, a particular side electrode only serves to actuate the beam corresponding thereto.

FIGS. 15A–15F illustrate the operation of beam actuator 400 illustrated in FIG. 12. In general, the beams 430 in set 410 are actuated synchronously or in tandem with corresponding beams in set 420, so that moving element 106 is transported in a straight path, as shown in FIG. 12. FIGS. 15A–15F show the actuation of the tips of four beams 430-1, 430-2, 430-3, and 430-4 in one of sets 410 or 420. As indicated, each set 410 and 420 may include any number of beams 430, but generally only a subset of those beams holds mirror element wing 126 at any one time.

Figure 15A:
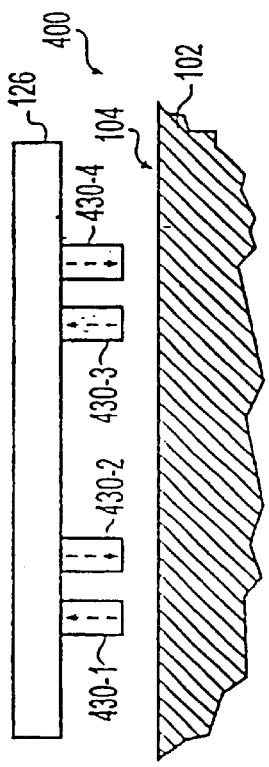
FIGS. 15A–15F show and illustrate the operation of the actuator of FIG. 12.
Figure 15B:
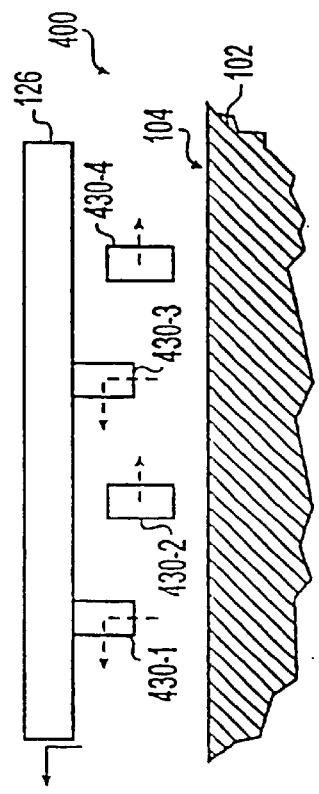

In FIG. 15A, the tips of beams 430-1, 430-2, 430-3, and 430-4 are in a first level position in which all four beam tips are at the same height above substrate 102 and all four beam tips are supporting wing 126 of moving element 106. Preferably, when moving element is in a desired operative position, e.g. an OFF switch position, beams 430-1, 430-2, 430-3, and 430-4 are in such a level position. Referring to FIG. 15B, upon actuation, the tips of beams 430-2 and 430-4 begin to move away from substrate 102 so that only members 430-2 and 430-4 support wing 126. Subsequently, the tips of beams 430-2 and 430-4 begin to be actuated to the left in FIG. 15B. As the tips of beams 430-2 and 430-4 move to the left in FIG. 15B, wing 126 is transported in the same direction. Since a corresponding actuation takes place simultaneously with respect to the other wing 126 of moving element 106, element 106 is thereby transported by actuator 400 in the same desired direction.

Figure 15C:
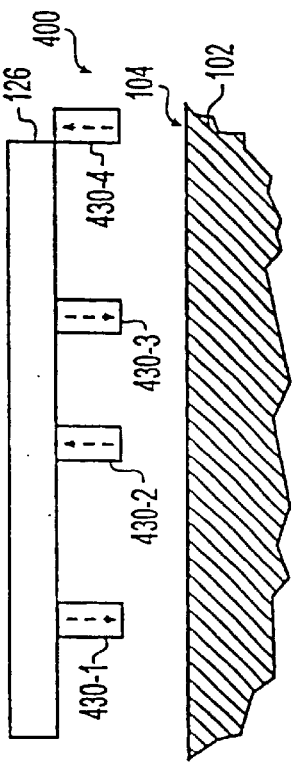
Figure 15D:
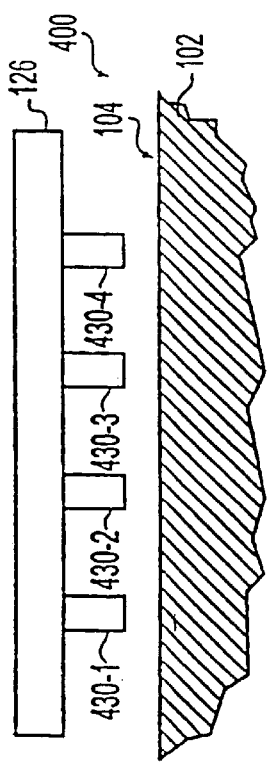
Figure 15E:
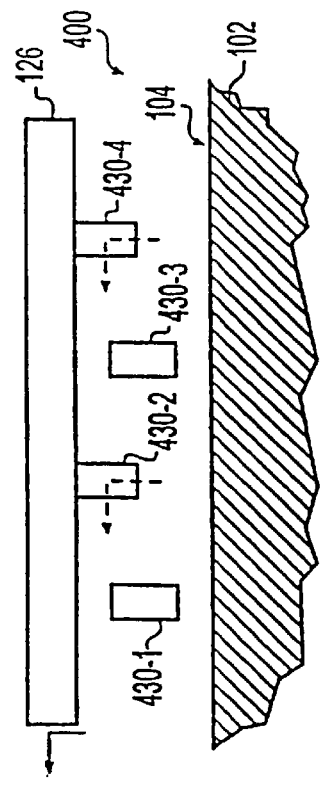
Figure 15F:
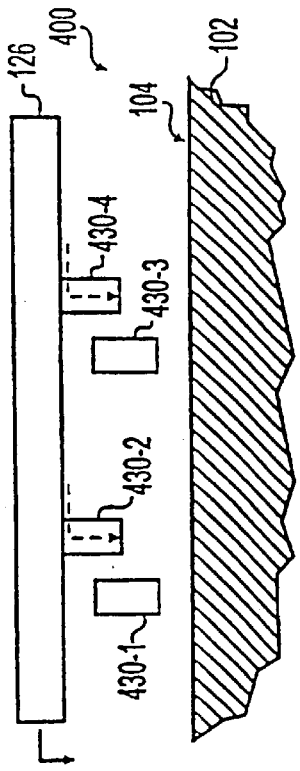

Next, referring to FIG. 15C, the upward actuation of the tips of beams 430-2 and 430-4 ceases and those beam tips move back down and toward substrate 102 until a second level position is reached in FIG. 15D. As with the first level position of FIG. 15A, all four beam tips support wing 126 of moving element 106 in the second level position of FIG. 15D, and moving element 106 lies in the same horizontal plane as in FIG. 15A. The tips of beams 430-1 and 430-3 are then actuated up and away from substrate 102 so that they begin to support wing 126 on their own. The tips of beams 430-1 and 430-3 are subsequently actuated to the left as shown in FIG. 15E, with wing 126 and element 106 moving in tandem. At the same time, the sideways or leftward actuation of beams 430-2 and 430-4 ends and these beam tips retreat, without affecting the movement of element 106 (see FIG. 15E), to their unactuated level position in FIG. 15A. The upward actuation of the tips of beams 430-1 and 430-4 ends and these beam tips move down and toward substrate 102 until, in FIG. 15F, the tips of all four beams 430-1, 430-2, 430-3, and 430-4 are all again in a level position. This process repeats itself until moving element 106 has moved sufficiently to the left and is in a desired operative position. As wing 126 moves outside the range of a particular beam tip, e.g. that of beam 430-4 in FIG. 15F, the actuation of that beam tip may end. Correspondingly, when wing 126 has moved on top or within the range of another beam tip, e.g. that of a beam immediately to the left of beam 430-1 in FIG. 15F, that beam tip begins to be actuated as described above.

As illustrated in FIGS. 15A–15F, the tips of alternate beams effectively undergo a rotation-like motion (resembling the rotation-like motion of the surface of the elastic material as shown at point 320 in FIG. 10C) to successively and repeatedly actuate moving element 106. In the illustrated embodiment of FIGS. 15A–1 5F, the rotation of the tips of the first pair of beams 430-1 and 430-3 and the rotation of tips of the second pair of beams 4302 and 430-4 (both counter-clockwise in FIGS. 12A–12F) are out of phase so that each pair successively acts to transport moving element in the desired direction. The amount of motion in each step depends on the horizontal amplitude of the beams. For example, a 2×2 µm beam that is 150 µm long preferably has a horizontal and vertical amplitude of about 1 µm (or less). Also, although, as illustrated in FIGS. 15A–15F, the rotation-like motion of the beams is preferably rectilinear, it may also be circular or elliptical, for instance. Furthermore, to move element 106 in the reverse direction, the rotation of the beam tips can simply be reversed.

If more than four beams 430 are underneath wing 126 of element 106 at a given position, the actuated motion of the beam tips may be more complex. For example, with six beam tips underneath wing 126 at a given position, the beam tips may be actuated as three separate groups or pairs whose rotation-like motions are generally 120° out of phase with one another.

As described, electrostatic beam actuation is preferably used because of the efficiency and ease of implementation of electrostatic forces in a microelectromechanical system. In particular, by controlling or modulating the timing and duration of voltage pulse signals applied to beams 430, bottom electrodes 440, and side electrodes 450 (e.g. using pulse width modulation), the tips of the actuating beams may be controllably rotated in a clockwise or anti-clockwise direction, translating moving element 106 as described above. Associated control circuitry used for this purpose is preferably microelectronically implemented within MEMS device 100, using convention integrated circuit fabrication techniques well known in the art. The frequency and phase relationship between applied voltage pulse signals, controls the direction and travelling speed of the movement of element 106. However, as indicated above, in the beam actuator embodiments described above and variations thereof, the rotation-like actuation of the beams 430 can be achieved by any of the different actuation methods described above. For example, beams 430 may comprise a piezoelectric crystalline material. In this case, by applying appropriate voltage pulse signals to the piezoelectric beams, they may be manipulated to mechanically bend in the horizontal and vertical directions, and thereby transport moving element 106 in a desired direction in the manner just described. As will be appreciated, the orientation and structure of beams 430 may vary, in particular depending on the type of actuation method used.

Thus, generally, in actuator 400 a plurality of elongated actuating beams 430 are spaced perpendicularly to the travel path of the moving element 106.. Each beam 430 extends above and preferably substantially parallel to surface 104 of substrate 102, and each beam has a base rigidly fixed with respect to substrate 102 (i.e. via anchor portion 460) and a tip that is preferably proximate or near an edge 406 of the moving element's travel path. Actuator 400 controllably causes the tips of the actuating beams 430 to rotate, so that the tips of the actuating beams that are located along the edge of the portion of the travel path in which the moving element is located intermittently engage the moving element. By intermittently engaging moving element 106 during their rotation. The tips serve to actuate the moving element in a desired direction along the travel path. Furthermore, it will be appreciated that actuator 400 can be adapted to actuate element 106 along other types of travel paths. For example, if moving element 106 is sector-shaped and moves in a radial or pendulum-like motion about a point 120 (see FIG. 3), beams 430 may be positioned to extend perpendicularly to and along substantially the entire radial travel path of element 106 (with element 106 rotatably fixed with respect to substrate 102 at point 120). In this case, only a single set of actuating beams 430 is required since the travel path only has a single, arc-shaped, outer edge.

Figure 16A:
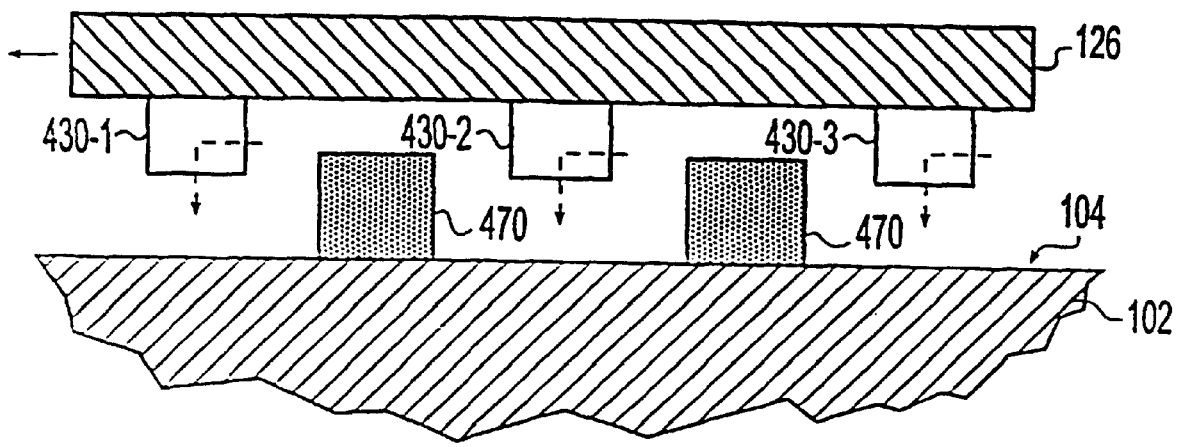
FIGS. 16A–16B illustrate the operation of an actuator based on a variation of the actuator of FIG. 12.
Figure 16B:
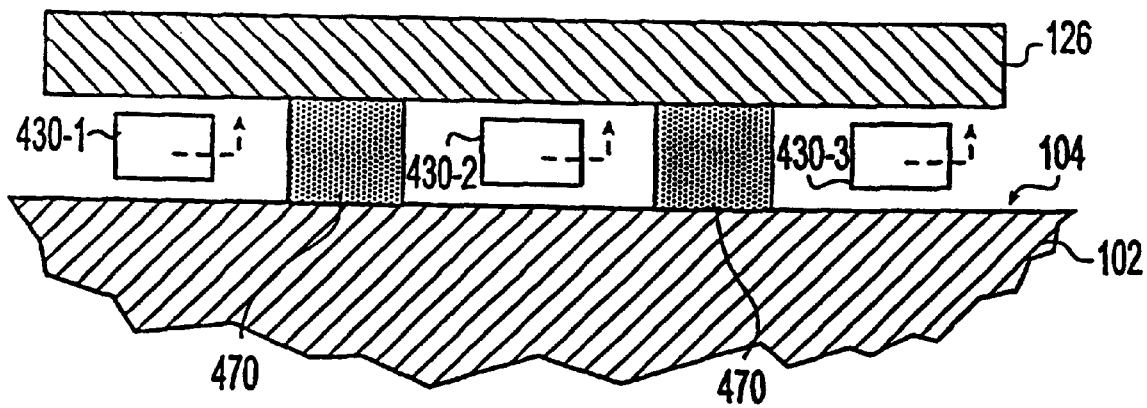

FIGS. 16A–16B illustrate a possible modification to the operation of the actuator 400. In the actuator embodiment of FIGS. 16A–16B, the tips of the beams 430-1, 430-2, 430-3 in beam set 410 (and beam set 420) rotate in unison, i.e. all in phase with one another. When moving element 106 is in a static operative position, wings 126 and/or element 106 are supported by fixed posts 470. Posts 470 preferably extend upwardly from surface 104 of substrate 102, but optionally posts 470 may be replaced with static beams that are not actuated. As shown in FIG. 16A, during actuation, the tips of beams 430-1, 430-2, 430-3 begin a rotation-like motion in which they are first actuated upwards (away from substrate 102) so that the tips rise above the level of posts 470, lifting wing 126 off posts 470. Subsequently, the beam tips are actuated in parallel to substrate 102, transporting moving element 106 in a desired direction (to the left in FIG. 16A). As the rotation-like motion of the tips of beams 430-1, 430-2, 430-3 continues, the upward actuation of the tips ends, so that the beam tips retreat or fall below the level of static posts 470 (see FIG. 16B). When this occurs, wing 126 is again held and supported by posts 470, although now at a different position in the horizontal plane above substrate 102. The sideways actuation of the tips of beams 430-1, 430-2, 430-3 also ceases at this stage. This rotation-like cycle is repeated until moving element 106 has been re-positioned to a desired operative location.

Figure 17:
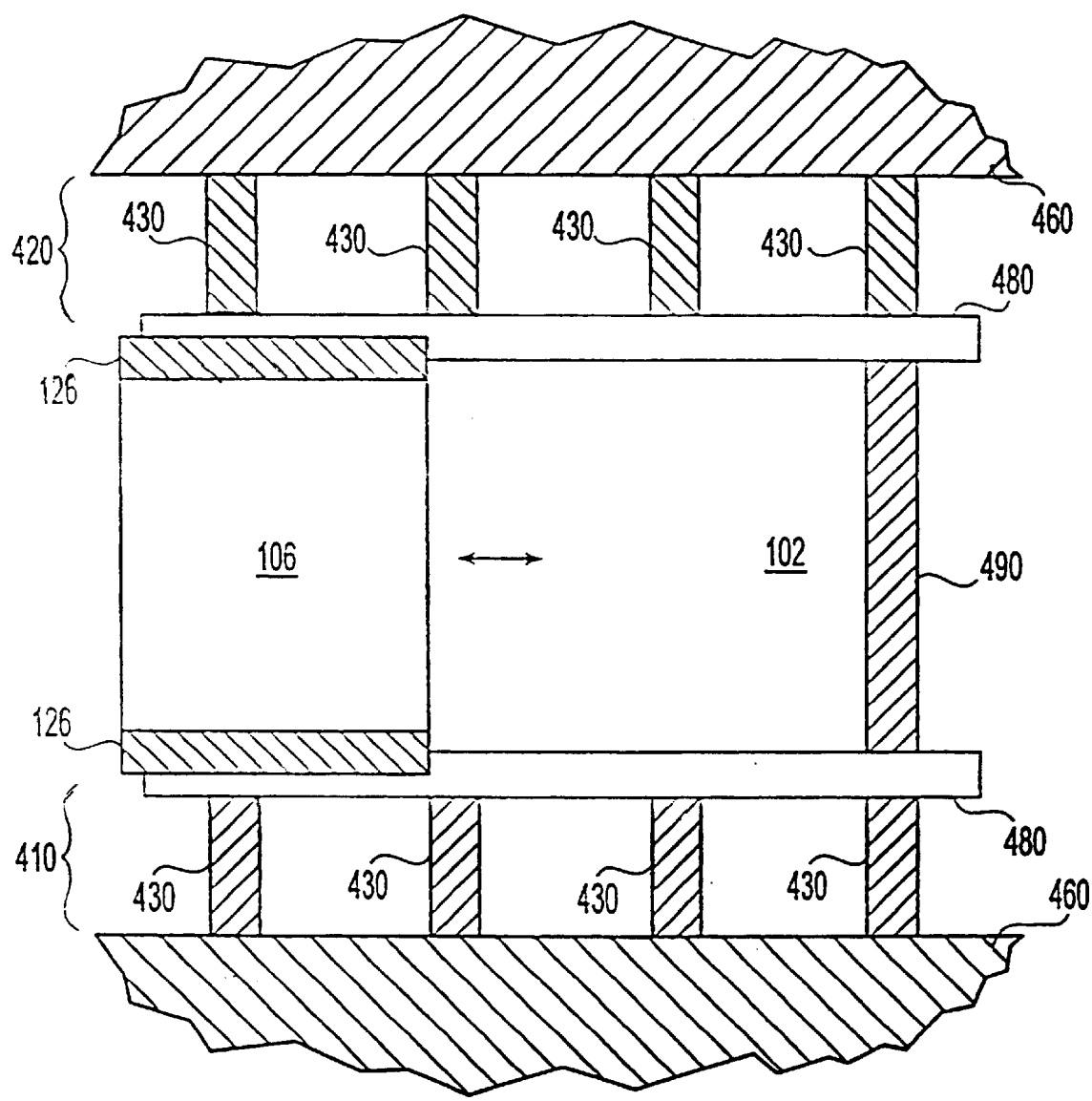
FIG. 17 illustrates a possible adaption to the actuator of FIGS. 16A–16B to ensure that the moving element's motion is linear.

FIG. 17 illustrates a possible adaption of an actuator 400 operating as described in connection with FIGS. 16A–16B which serves to ensure that the motion of element 106 is linear and that element 106 is not undesirably tilted. As described above, element 106 is actuated at opposite ends by two synchronously operating sets 410 and 420 of beams 430 extending from base portions 460. As shown in FIG. 17, the tips of beams 430 in each set 410 and 420 are connected to a connecting support beam 480 which supports and holds a wing 126 of element 106. Connecting support beams 480 increase the cumulative actuation force generated by the individual tips of beams 430 and also act to further synchronize the operation and movement of the beam tips. As a result, moving element 106 is evenly held and supported from both sides. In the embodiment of FIG. 17, the tips of all beams in each group are actuated in phase during actuation of moving element 106, regardless of the position of element 106 within its range of travel. One or more additional synchronization beams 490, linking the connecting support beams 480, may also be used to further synchronize the actuation operation of each set 410, 420 of beams 430. Preferably, at least two synchronization beams 490 are used, one near each end of beams 480 (only one beam 490 is shown in FIG. 17).

Furthermore, as will be appreciated, it is also possible to rotate moving element 106 in the horizontal plane by, for example, operating the two sets 410, 420 of beams 430 out of phase. Other types of more complicated movements of element 106 may also be achieved by combining additional sets of beams in different possible configurations and synchronizing those beam sets accordingly.

Figure 18A:
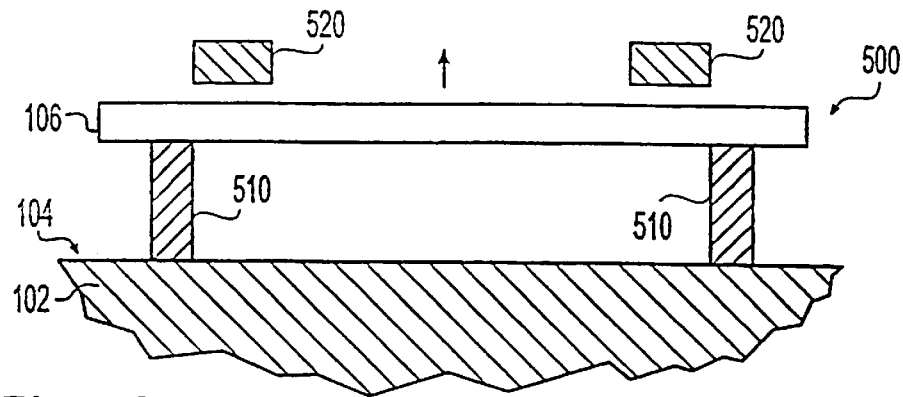
FIGS. 18A–18D illustrate the operation of another possible actuator for use in the MEMS device of the present invention.
Figure 18B:
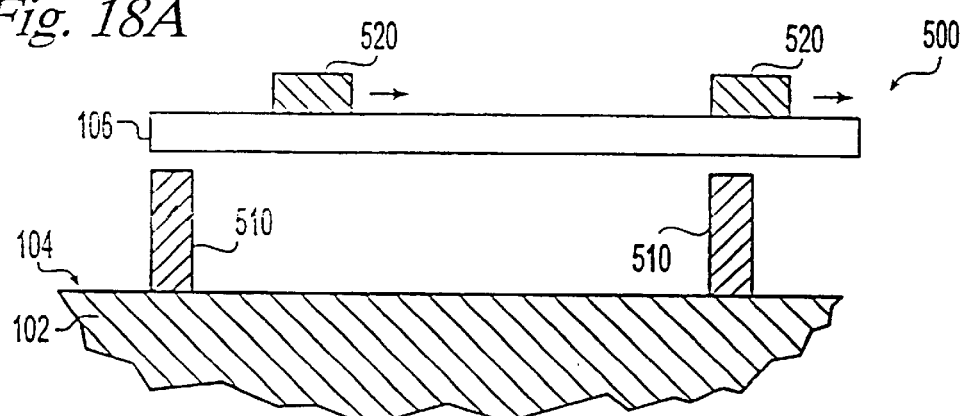

FIGS. 18A–18D illustrate the operation of another possible actuator 500 for use in MEMS device 100 of the present invention. In this embodiment, when element 106 is in an operative position, e.g. the OFF position for an optical switch MEMS device 100, element 106 is held on static posts 510 extending from surface 104 of substrate 102, as shown in FIG. 18A. Alternatively, moving element 106 may have legs 510 that rest on surface 104 of substrate 102. Actuator 500 further includes beams 520 whose tips are located above and apart from moving element 106 (or a wing or other appendage thereof) when the latter is in an un-actuated or operative state. As with actuator 400 described above, beams 520 are preferably attached to substrate 102 by way of an anchor or base portion (not shown). Upon actuation, moving element 106 is raised from the posts 510 and attaches to beams 520. Preferably, beams 520 are conductive allowing an attractive electrostatic force to be generated between beams 520 and a conducting component of element 106 (also not shown). However, magnetic attraction may also be used for this purpose. Beams 520 are preferably relatively rigid in vertical direction, so that the tips of beams 520 do not bend substantially when attracting element 106. Once element 106 is attached to the tips of beams 520, the tips of beams 520 are actuated in a desired horizontal or sideways direction (FIG. 18B). The combination of the attraction of element 106 and actuation of the tips of beams 520 moves element 106 in a desired direction.

Figure 18C:
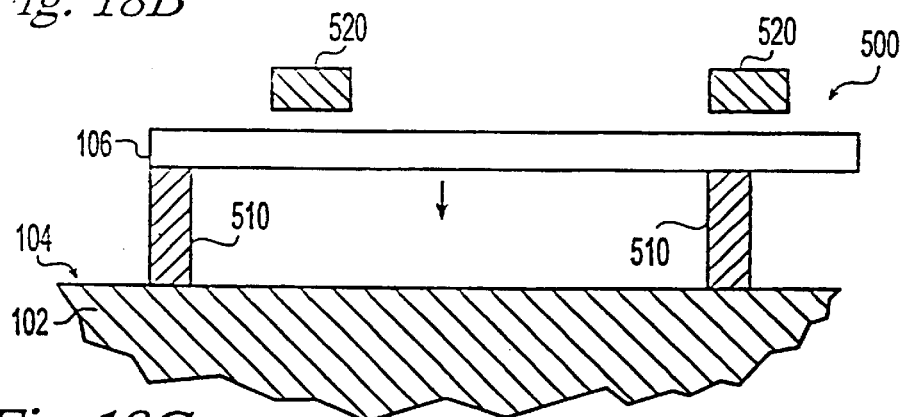
Figure 18D:
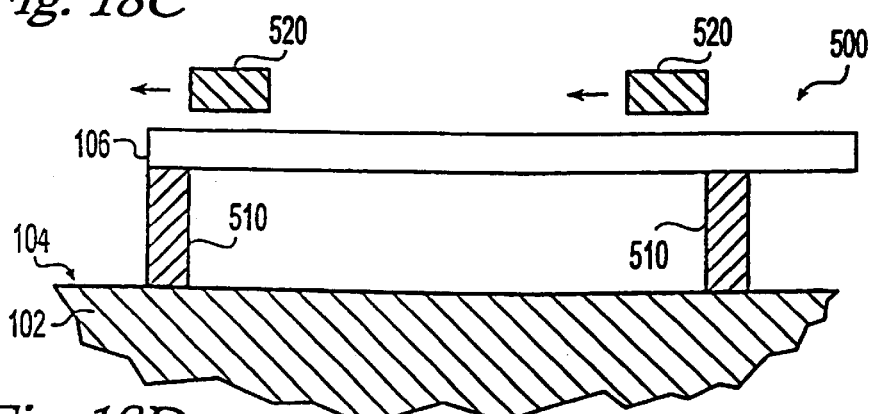

Once element 106 is moved to a desired horizontal location, the attraction between beams 520 and element 106 is ended so that moving element 106 is released and again held by posts 510, as shown in FIG. 18C. The actuation of the tips of beams 520 also ceases so that they return to their unactuated position. If element 106 is to be moved further in the same direction, the above actuation steps are repeated. Once again, it should be clear that in this embodiment, as with all of the embodiments of the present invention, the terms "up", "down", "lower", "upper", "top", and "bottom" are used merely for illustrative purposes, and that MEMS device 100 can operate independently of its overall orientation.

Figure 19:
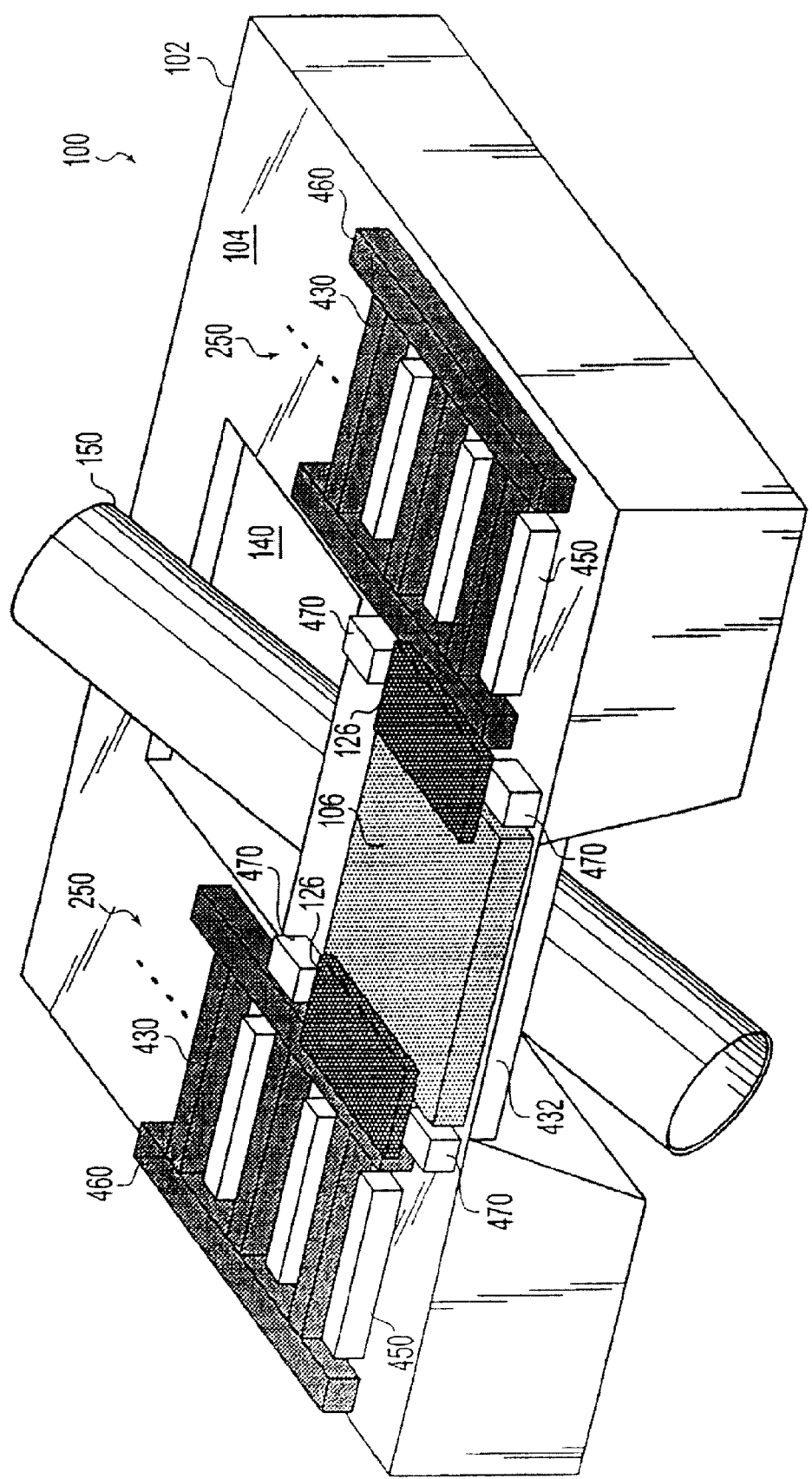
FIG. 19 shows an isometric view of the MEMS device use as an optical switch and comprising an actuator operating as described above in connection with FIGS. 16A–16B.

FIG. 19 shows an isometric view of a MEMS device 100 for use as an optical switch and comprising a mirror as moving element 106 and actuator 250 operating as described above in connection with FIGS. 16A–16B (again, for clarity, the entire actuator 250 is not shown in FIG. 19 as indicated by the ellipses). The optical switch is shown in FIG. 19 in an OFF position in which an input light signal 150 travels through penetrable zone 140 of substrate 102 comprising a hole or aperture formed within the substrate. It should be noted that the thin rectangular portion 432 of substrate 102 that lies underneath element 106 when it is in the OFF position is optional and may be removed.

Figure 20:
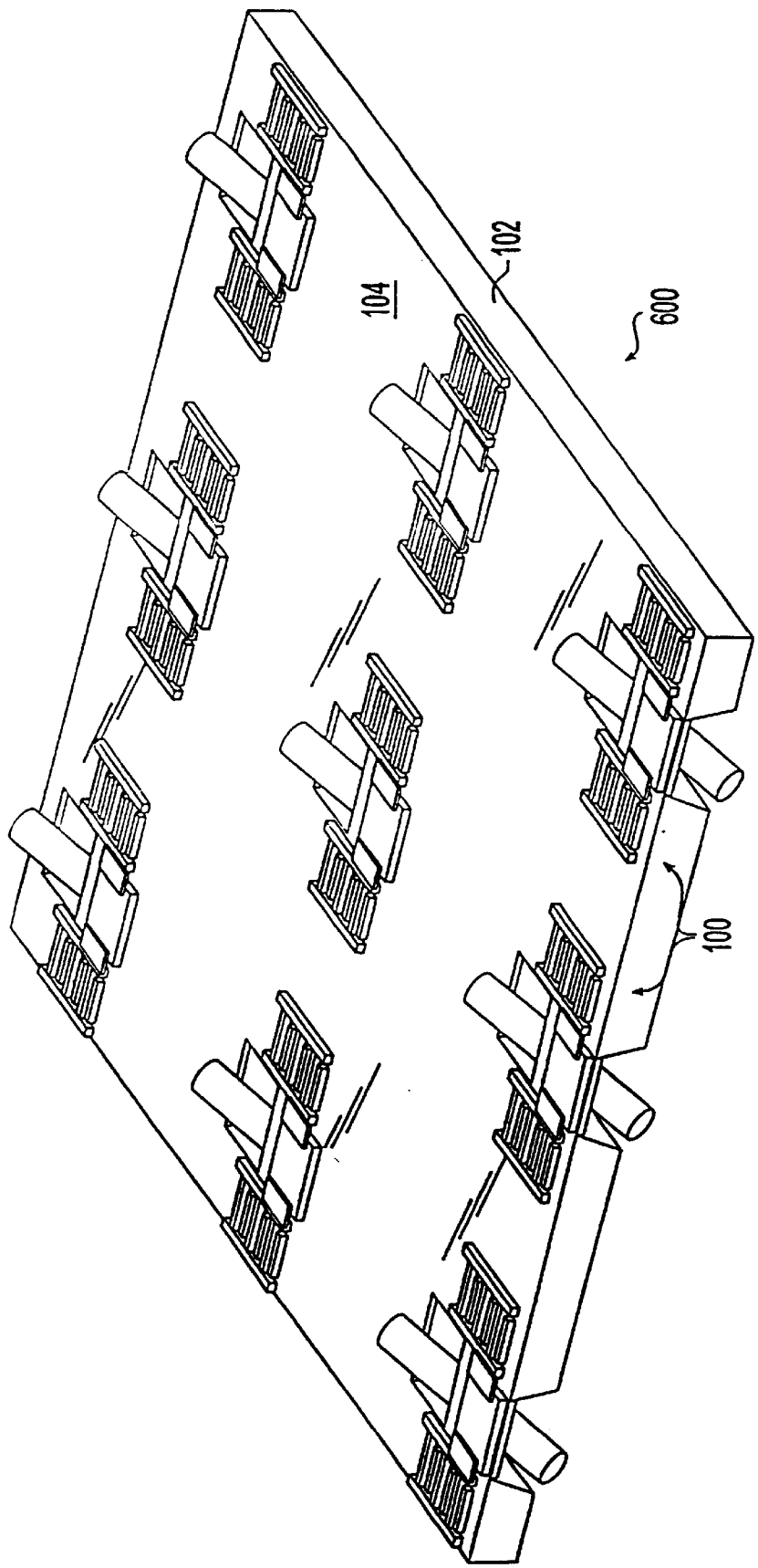
FIG. 20 shows a 3×3 common substrate array of the switches shown in FIG. 19.

It will be appreciated that the present invention is capable of providing switching devices with a number of inputs M and outputs N for a variety of applications, such as optical cross-connects, by employing a plurality of switches. Preferably, the moving elements in the switches are actuated and move in directions that are parallel to one another. For example, the switches may share a common substrate so that the moving elements of each switch are generally coplanar. FIG. 20 shows such a two-dimensional switching device comprising a 3×3 array 600 of switches 100, each of the switches being as shown in FIG. 19. Switches 100 provide a 3×3 array of inputs and outputs arranged in rows and columns. Again, for clarity, each switch in FIG. 12 is shown in an OFF position in which an input light beam or optical signal passes through substrate 102 by way of a penetrable zone 140, however each switch 100 in array configuration 300 is independently actuable.

Mor complex switching configurations may also be provided. For example, the moving elements of switches 100 on a common substrate may move in horizontal planes that are parallel, i.e. at different heights above the surface 104 of substrate 102—possibly with one moving element directly on top of another. By appropriately positioning the inputs and outputs of the switch, possibly at an angle to the horizontal plane(s) in which the moving elements are actuated, a desired optical switching configuration can be achieved. Furthermore, several substrate layers having switches may be combined to provide two- and three-dimensional cross-connect configurations as described in applicant's co-pending U.S. patent application Ser. No. 09/619,014 filed Jul. 19, 2000, titled "Switching Device and Method of Fabricating the Same" filed simultaneously herewith, and incorporated herein by virtue of this reference.

The fabrication of MEMS device 100 and its various components may be achieved using conventional macromachining, mesomachining, or micromachining techniques. Preferably, micromachining technology—including the well-known photolithography, deposition, and etching fabrication methods used in the microelectronics and micromachining industries—is used to manufacture all of the components of device 100. See generally, Chertkow et al., "Opportunities and Limitations of Existing MicroFabrication Methods for Microelectromechanical Devices", Proc. 25$^{th}$ Israel Conf on Mechanical Engineering, Technion City, Haifa, Israel, p. 431 (May 1994) and Petersen, "Silicon as a Mechanical Material", *Proceedings of the IEEE*, vol. 70, no. 5 (May 1982), the contents of which are hereby incorporated herein by virtue of this reference. Batch manufacturing of MEMS devices in integrated circuit fabs or foundries permits the production of large volumes of devices at extremely low cost.

Micromachining fabrication technology includes both bulk and surface micromachining processes. With bulk micromachining techniques, microstructures are formed by etching away the bulk of a silicon wafer to produce the desired structure. On the other hand, surface micromachining techniques build up the structure in layers of thin films on the surface of a suitable wafer substrate. Typically, films of a structural material and a sacrificial material are deposited and etched in sequence. Generally. the more mechanical layers used during surface micromachining, the more complex the structure and the more difficult fabrication becomes. Once the desired structure has been formed, the sacrificial material is etched away to release the structure. Due to its mechanical properties and compatibility with modern integrated circuit fabrication processes, polysilicon, i.e. polycrystalline silicon, is preferably used as the MEMS structural material. Polysilicon is strong, flexible, fatigue-resistant, and highly-compatible with integrated circuit fabrication techniques.

MEMS device 100 is preferably built using this type of sacrificial polysilicon surface Micromachining technology, which as described above, enables the mass production of complex microelectromechanical systems, by themselves or integrated with microelectronics. FIGS. 21A–21I illustrate a preferred method of fabricating the mechanical structure of the MEMS device 100, including actuator 400, of FIG. 12 using surface micromachining techniques. More specifically, FIGS. 21A–21I show a cross-sectional side view of device 100 during the various steps in the fabrication process.

Before micromachining begins, substrate 102 is selected and prepared. Generally, substrates of different materials, dimensions, thickness, and surface preparation may be used, although the physical dimensions of substrate 102 may be dictated by the purpose and operation of device 100. Furthermore, as described above, in the case of an optical switch device part of substrate 102 may be removed (bulk etched) to provide a transparent or penetrable zone 140 in substrate 102 (see FIG. 4). Furthermore, where MEMS device 100 is an optical switch and moving element 106 is a mirror, the surface preparation of substrate 102 (including surface 104) is preferably of high quality so that the reflective surface 108 (see FIG. 1) of the mirror can also be provided with a high degree of surface quality, especially in terms of flatness and parallelism.

Figure 21A:
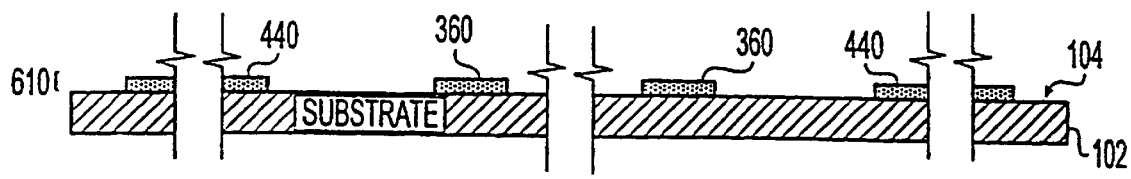
FIGS. 21A–21I illustrate possible steps in fabricating the MEMS device of the present invention.
Figure 21B:
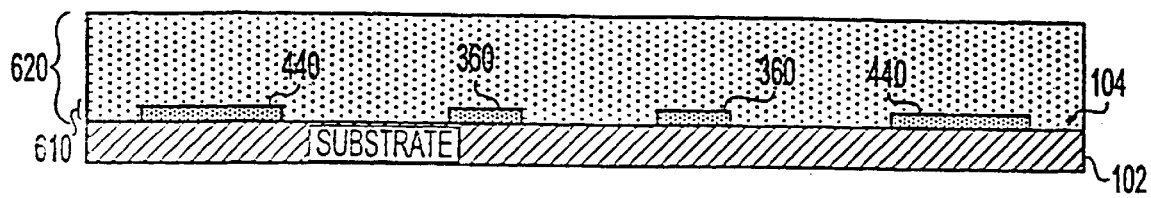
Figure 21C:
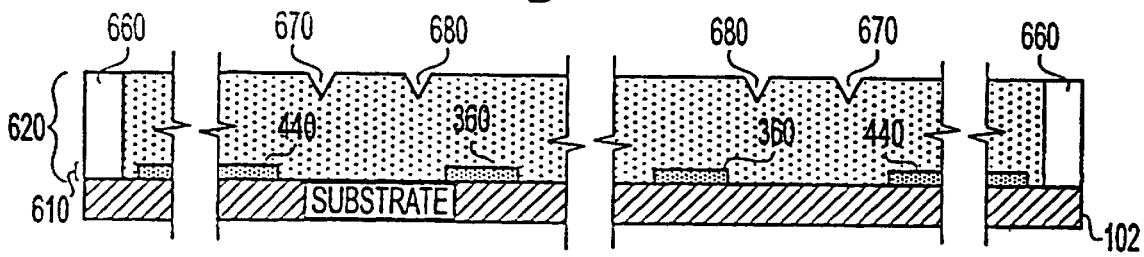

Once a suitable substrate 102 has been prepared, a first polysilicon layer 610 is deposited on the surface 104 thereof Polysilicon layer 610 is photolithographically patterned before undergoing chemical etching. As is well known in integrated circuit fabrication processes, a two-dimensional mask may be used to define the patterns to be etched. As illustrated in FIG. 21A, the deposition and patterning of polysilicon layer 610 forms bottom electrodes 440 and substrate electrodes 360 used for electrostatic attachment. In FIG. 21B, an oxide (e.g. silicon dioxide) layer 620 is deposited on top of substrate 102 and the remaining polysilicon layer 610. Oxide layer 620 is then patterned and etched to provide slots 660 for the subsequent deposition of anchor portions 460, dimples 670 for fin legs 432 of beams 430, and dimples 680 for fin legs 128 of moving element 106. This is shown in FIG. 21C.

Figure 21D:
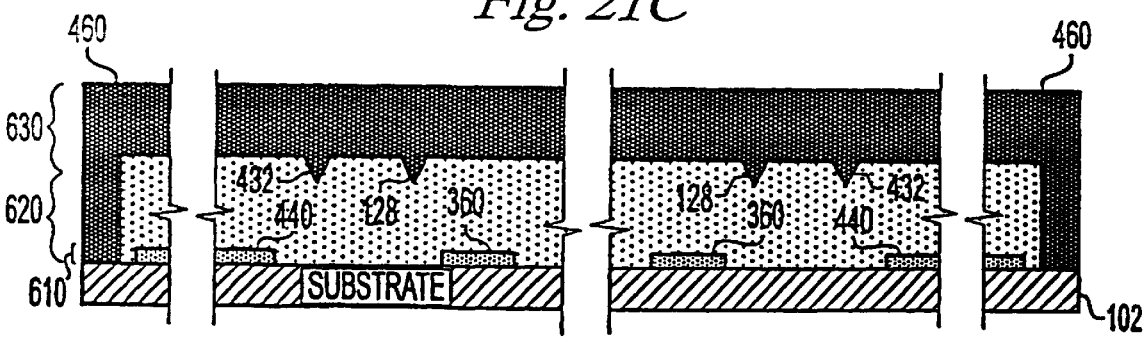
Figure 21E:
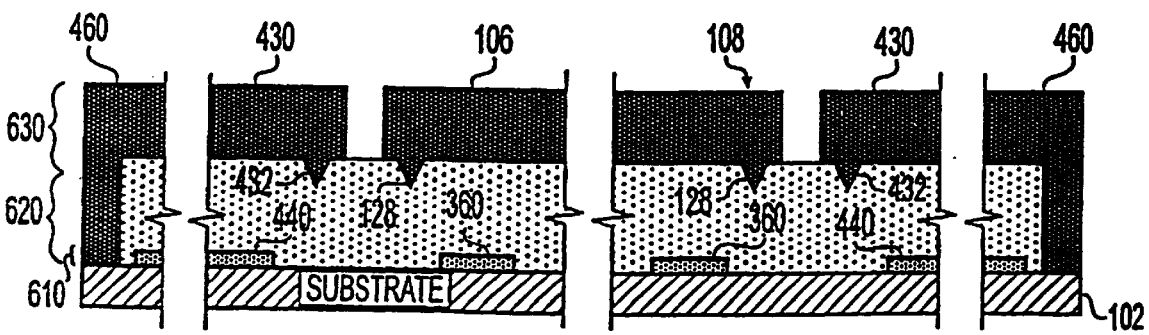

In FIG. 21D, a second polysilicon layer 630 is deposited on top of oxide layer 620 and into slots 660, 670, and 680 to form anchor portions 460, fin legs 432, and fin legs 128 respectively. Further patterning and etching of polysilicon layer 630 produces beams 430 and moving element 106, as shown in FIG. 21E. Where moving element 106 is a mirror, its top surface 108 may be coated with gold or aluminum, for example, using standard deposition and patterning methods to render surface 108 reflective. As indicated, to minimize losses, any mirror or other optical element used in MEMS device 100 should be designed to be very smooth. Furthermore, as described in detail above, in the case of an optical switch, the mirror is provided above substrate 102 in an area in which input light beams will be directed, below which substrate 102 is either absent or transparent. However, for other types of MEMS devices moving element 106 may be fabricated in other positions above substrate 102.

Figure 21F:
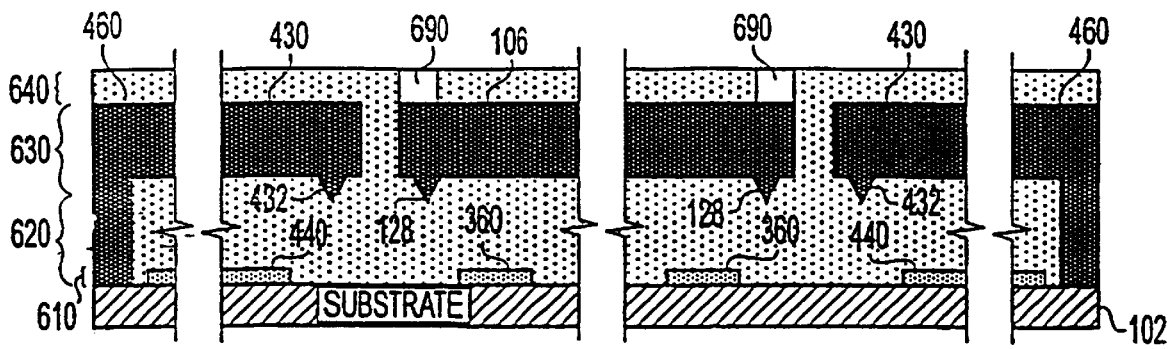
Figure 21G:
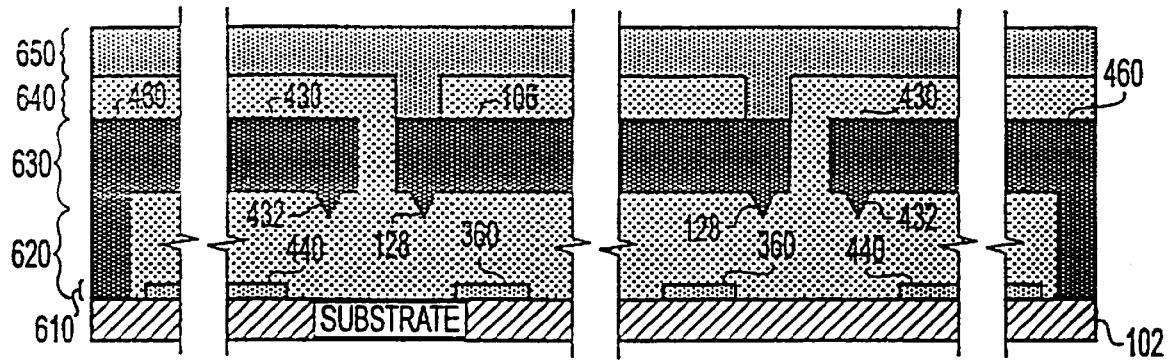
Figure 21H:
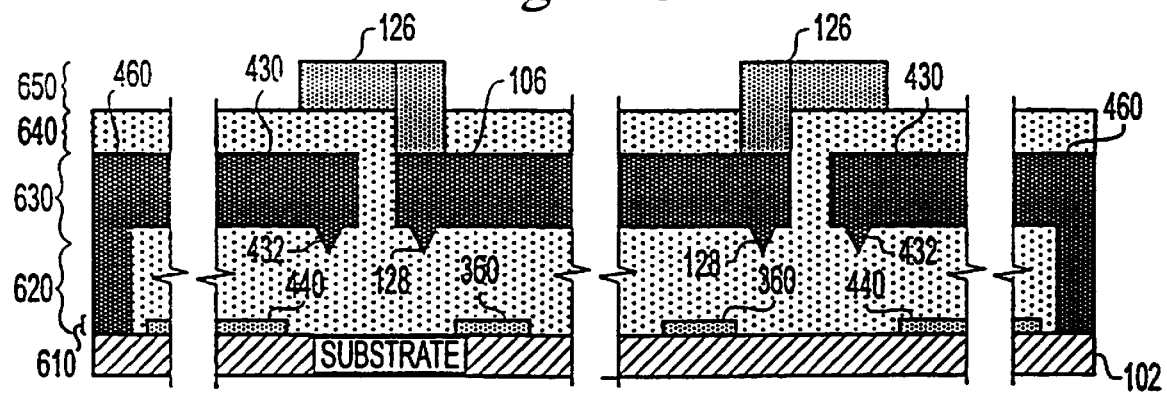
Figure 21I:
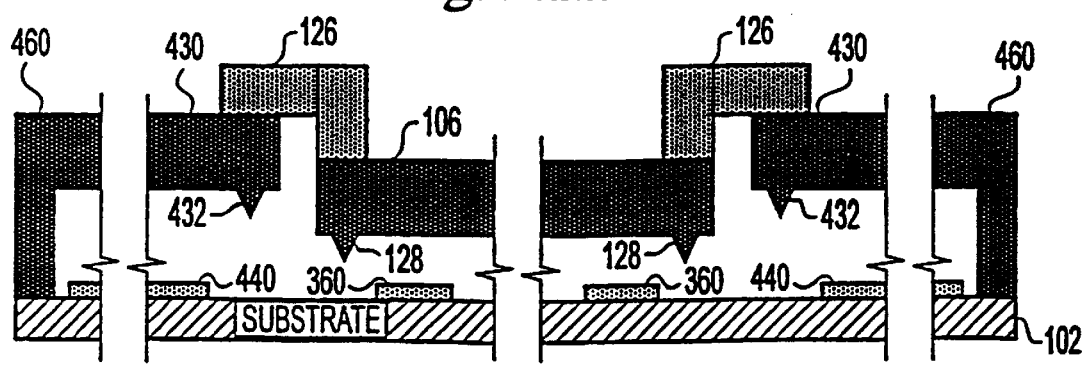

In FIG. 21F, a further oxide layer 640 is deposited, as shown. Patterning and etching of layer 640 is carried out to provide slots 690 for wings 126 of moving element 106. Polysilicon layer 650 is subsequently deposited, as shown in FIG. 21G; and patterning and etching of layer 650 results in wings 126, as shown in FIG. 21H. At this stage, the deposition and patterning of the mechanical layers is complete. As a result, in FIG. 21I, the remainder of oxide layers 620 and 640 is chemically removed, leaving behind the desired polysilicon mechanical structures. Alternatively, release of the mechanical structures may be accomplished by etching steps.

In general, fabrication of the associated microelectronics (not shown) for MEMS device 100 may be performed simultaneously with, before, or after, the above described surface machining steps. It will be appreciated that alternative and further fabrication steps will be required for different types of actuators and/or different types of actuation and/or attachment principles. In addition, different configurations and applications of MEMS device 100 may alter or vary the fabrication details and materials used. Furthermore, other fabrication processes may also be used, although it is highly preferable that the fabrication of moving element 106 take place above the highly smooth and planar surface 104 of substrate 102, as explained above.

It will be appreciated that the MEMS device of present invention, which includes a generally flat moving element such as a mirror disposed horizontally above a smooth wafer substrate, provides several advantages. The device 100 allows for a fast actuation response, low losses, compact structure, and relatively large actuation displacements, unlike prior art devices that form the moving element by etching into the substrate wafer. The actuation of the moving element in the present invention effectively occurs in parallel to the substrate as a translation, thus minimizing any air resistance and providing more favorable actuation performance from the stand point of inertia and energy considerations. Importantly, because of the high degree of planarity of substrate 102 and moving element 106 during fabrication, the design and positioning of the moving element in the present invention avoids small deviations that can significantly affect device operation accuracy, as may occur in prior art devices in which a moving element or mirror is disposed vertically with respect to the substrate or in prior art devices in which the moving element tilts with respect to the substrate. As indicated, MEMS device 100 may have a relatively long travel path, so that there is no overlap between operative positions of moving element 106 in terms of the location of these positions in the plane above substrate 102.

While preferred actuation embodiments uses surface elastic wave motion or actuating beams to translate the moving element from a first operative position in a horizontal plane above the substrate to a second operative position in that horizontal plane, actuators based on other actuation techniques can also be used. In addition the physical phenomenon used to generate the required actuation forces may be based on various physical principles including: thermomechanical; shape memory alloys (SMA) and thermal actuation; electromagnetic; electrostatic; or piezoelectric, magnetic, diamagnetic, mechanical, or material phase change. Also, while the moving element is preferably held by static friction induced by an electrostatic or magnetic force, as described above, other support and attachment configurations for the moving element may also be used.

MEMS device 100 may be advantageously implemented for applications relating to fiber optic communication, such as optical switches, valves, collimators, attenuators, and the like. In particular, MEMS device 100 of the present invention can be used as an optical switching element, and such elements can be further combined to form large optical switching arrays and cross-connects as described, for example, in applicant's co-pending U.S. patent application Ser. No. 09/619,014. Furthermore, use of the preferred actuators described above allows faster response times than prior art MEMS switches. For example, switching times of the order of 10 ms may be achieved with a MEMS optical switching device of the present invention for a 150–300 µm horizontal displacement during actuation. Moreover, use of the preferred actuators and preferred mechanisms for attaching moving element 106 permits the device to be actuated or switched with minimal dynamical friction thereby reducing wear and increasing reliability.

More generally, however, the present invention is also suitable for other applications requiring relatively large micro-actuation of a generally flat moving element, such as in a micro-conveyor system, or a switch for other types of waves—e.g. an acoustic wave switch in which the moving element is an acoustic mirror (the acoustic mirror may be a metallic plate, as will be appreciated).

Thus generally, while the invention has been described in conjunction with specific embodiments, it is evident that numerous alternatives, modifications, and variations will be apparent to those skilled in the art in light of the foregoing description.

What is claimed is:

1. A microelectromechanical (MEMS) device comprising:
   (a) a substrate having a surface;
   (b) a generally planar moving element disposed in parallel to the surface of the substrate; and
   (c) an actuator operatively engageable with the moving element for selectively moving the element between a first position in a plane horizontal to the surface of the substrate and a second position in that plane, wherein the actuator comprises:
      an elastic material having a surface and positioned between the substrate and the moving element; and
      an elastic wave inducer for generating a traveling elastic wave on said surface of the elastic material, the propagation of said elastic wave on said surface serving to move the moving element.

2. The MEMS device of claim 1 wherein the elastic wave inducer comprises: a first substrate electrode, a second substrate electrode, a ground electrode coupled between the moving element and the surface of the elastic material, and circuitry for providing a first AC electric signal between the first substrate electrode and the ground electrode and a second AC electric signal between the second substrate electrode and the ground electrode, the first and second AC electric signals being out of phase with one another.

3. The MEMS device of claim 1 wherein the moving element includes a conductive component and the device further comprises: at least one substrate electrode and circuitry for generating an electric field between the conductive component and the at least one substrate electrode to hold the moving element by means of static friction.

4. The MEMS device of claim 1 wherein the moving element includes a conductive component and the device further comprises: a first substrate electrode, a second substrate electrode, and circuitry for generating an electric field between the first substrate electrode and the second substrate electrode; whereby the electric field induces a further electric field between the conductive component and at least one of the first and second substrate electrodes to hold the moving element by means of static friction.

5. A microelectromechanical (MEMS) device comprising:
   (a) a substrate having a surface;
   (b) a generally planar moving element disposed in parallel to the surface of the substrate, wherein the moving element rests on static support members fixed to the substrate and has a travel path between the first and second positions; and
   (c) an actuator operatively engageable with the moving element for selectively moving the element between a first position in a plane horizontal to the surface of the substrate and a second position in that plane, wherein the actuator comprises:
      a plurality of elongated actuating beams spaced perpendicularly to and along an edge of the travel path of the moving element, each beam extending substantially parallel to the surface of the substrate and having a tip and a base rigidly fixed with respect to the substrate;
      beam attachment means for controllably holding the moving element to the actuating beams that are located along the edge of the portion of the travel path in which the moving element is located; and
      a beam tip actuator for controllably moving the actuating beams, when the moving element is being held thereto, in a desired direction along the travel path.

6. A microelectromechanical (MEMS) device comprising:
   (a) a substrate having a surface;
   (b) a generally planar moving element disposed in parallel to the surface of the substrate; and
   (c) an actuator operatively engageable with the moving element for selectively moving the element from a first position in a plane horizontal to the surface of the substrate to a second position in that plane such that the path of an optical beam directed at the device is not affected by the element when the element is in the first position and is affected by the element when the element is in the second position, wherein the actuator comprises:
      an elastic material having a surface and positioned between the substrate and the moving element; and
      an elastic wave inducer for generating a traveling elastic wave on said surface of the elastic material, the propagation of said elastic wave on said surface serving to move the moving element.

7. A microelectromechanical (MEMS) device comprising:
   (a) a substrate having a surface;
   (b) a generally planar moving element disposed in parallel to the surface of the substrate; and
   (c) an actuator operatively engageable with the moving element for selectively moving the element from a first position in a plane horizontal to the surface of the substrate to a second position in that plane such that the path of an optical beam directed at the device is not affected by the element when the element is in the first position and is affected by the element when the element is in the second position, wherein the actuator comprises:
      a plurality of elongated actuating beams spaced perpendicularly to and along a travel path of the moving element, each beam having a tip and a base that is rigidly fixed with respect to the substrate; and
      a beam actuator for controllably moving the actuating beams so that the beams that are positioned along the portion of the travel path in which the moving element is located intermittently engage the moving element and thereby move the moving element in a desired direction along the travel path.

8. A microelectromechanical (MEMS) device comprising:
   (a) a substrate having a surface;
   (b) a generally planar moving element disposed in parallel to the surface of the substrate, wherein the moving element rests on static support members fixed to the substrate and has a travel path between the first and second positions; and
   (c) an actuator operatively engageable with the moving element for selectively moving the element from a first position in a plane horizontal to the surface of the substrate to a second position in that plane such that the path of an optical beam directed at the device is not affected by the element when the element is in the first position and is affected by the element when the element is in the second position, wherein the actuator comprises:
      a plurality of elongated actuating beams spaced perpendicularly to and along an edge of the travel path of the moving element, each beam extending substantially parallel to the surface of the substrate and having a tip and a base rigidly fixed with respect to the substrate;

beam attachment means for controllably holding the moving element to the actuating beams that are located along the edge of the portion of the travel path in which the moving element is located; and a beam tip actuator for controllably moving the actuating beams, when the moving element is being held thereto, in a desired direction along the travel path.

9. A microelectromechanical (MEMS) device comprising:
(a) a substrate having a surface;
(b) a generally planar moving element disposed in parallel to the surface of the substrate; and
(c) an actuator operatively engageable with the moving element for selectively moving the element between a first position in a plane horizontal to the surface of the substrate and a second position in that plane, wherein the actuator comprises:
  a plurality of elongated actuating beams spaced perpendicularly to and along a travel path of the moving element, each beam having a tip and a base that is rigidly fixed with respect to the substrate; and
  a beam actuator for controllably moving the actuating beams so that the beams that are positioned along the portion of the travel path in which the moving element is located intermittently engage the moving element and thereby move the moving element in a desired direction along the travel path.

10. The MEMS device of claim 9 wherein the travel path is linear and has first and second edges, and wherein the plurality of actuating beams comprises: a first set of actuating beams spaced along the first edge of the travel path; and a second set of actuating beams spaced along the second edge of the travel path, the beam actuator controllably moving the tips of the beams in the first set synchronously with the tips of the beams in the second set.

11. The MEMS device of claim 10 wherein the moving element rests on static support members fixed to the substrate, and wherein, in each of the first and second sets, the actuating beams that are located along the edge of the portion of the travel path in which the moving element is located rotate in phase so that the intermittent engagement of the moving element by said beams in each set is simultaneous.

12. The MEMS device of claim 11 wherein the tips of the actuating beams in the first set are connected to one another by means of a first connecting support beam and the tips of the actuating beams in the second set are connected to one another by means of a second connecting support beam.

13. The MEMS device of claim 12 wherein the first and second connecting support beams are further connected to one another by means of one or more synchronizing beams.

14. The MEMS device of claim 10 wherein the tips of the first set of actuating beams are located proximate to the first edge of the travel path; and the tips of the second set of actuating beams are located proximate to the second edge of the travel path.

15. The MEMS device of claim 14 wherein the moving element comprises wings extending from said moving element at each of the first and second edges of the travel path, and wherein the wings are operatively engageable with the tips of the actuating beams.

16. A method of fabricating the MEMS device of claim 10 using surface micromachining techniques comprising sequentially depositing and etching a plurality of material layers.

17. The method of claim 16 comprising:

depositing a first structural material layer on the surface of the substrate, and patterning and etching the first structural material layer;

depositing a first sacrificial material layer on top of the first structural material layer, and patterning and etching the first sacrificial material layer;

depositing a second structural material layer on top of the first sacrificial material layer, and patterning and etching the second structural material layer;

depositing a second sacrificial material layer on top of the second structural material layer, and patterning and etching the second sacrificial material layer;

depositing a third structural material layer on top of the second sacrificial material layer, and patterning and etching the third structural material layer; and removing the remainder of the first and second sacrificial material layers to release the device.

18. The MEMS device of claim 10 wherein the beams are conductive and the beam actuator comprises, for each actuating beam:

a first electrode connected to the substrate and positioned vertically from said actuating beam with respect to the surface of the substrate;

a second electrode connected to the substrate and positioned horizontally from said actuating beam with respect to the surface of the substrate; and circuitry for controllably generating a first electric field between the first electrode and said actuating beam to move the tip of said actuating beam in a vertical direction with respect to the surface of the substrate, and a second electric field between the second electrode and said actuating beam to move the tip of said actuating beam in a horizontal direction with respect to the surface of the substrate.

19. The MEMS device of claim 10 wherein, in each of the first and second sets, adjacent ones of the actuating beams that are located along the edge of the portion of the travel path in which the moving element is located rotate out of phase so that the intermittent engagement of the moving element by adjacent tips in each set is successive.

20. The MEMS device of claim 9 wherein the beams are conductive and the beam actuator comprises, for each actuating beam:

a first electrode connected to the substrate and positioned vertically from said actuating beam with respect to the surface of the substrate;

a second electrode connected to the substrate and positioned horizontally from said actuating beam with respect to the surface of the substrate; and circuitry for controllably generating a first electric field between the first electrode and said actuating beam to move said actuating beam in a vertical direction with respect to the surface of the substrate, and a second electric field between the second electrode and said actuating beam to move said actuating beam in a horizontal direction with respect to the surface of the substrate.

21. The MEMS device of claim 9 wherein the moving element includes a conductive component and the device further comprises: at least one substrate electrode and circuitry for generating an electric field between the conductive component and the at least one substrate electrode to hold the moving element by means of static friction.

22. The MEMS device of claim 9 wherein the moving element includes a conductive component and the device further comprises: a first substrate electrode, a second substrate electrode, and circuitry for generating an electric field between the first substrate electrode and the second substrate electrode; whereby the electric field induces a further electric field between the conductive component and at least one of the first and second substrate electrodes to hold the moving element by means of static friction.

* * * * *